(12) United States Patent
Kawamura et al.

(10) Patent No.: US 11,665,898 B2
(45) Date of Patent: May 30, 2023

(54) SEMICONDUCTOR DEVICE AND PHOTOMASK

(71) Applicant: Kioxia Corporation, Tokyo (JP)

(72) Inventors: Daisuke Kawamura, Kiyosu (JP); Go Oike, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 17/204,487

(22) Filed: Mar. 17, 2021

(65) Prior Publication Data

US 2022/0068950 A1  Mar. 3, 2022

(30) Foreign Application Priority Data

Aug. 25, 2020 (JP) .............................. JP2020-141795

(51) Int. Cl.
| | |
|---|---|
| *H01L 27/11578* | (2017.01) |
| *H01L 27/11519* | (2017.01) |
| *H01L 27/11526* | (2017.01) |
| *H01L 27/11565* | (2017.01) |
| *H01L 27/11573* | (2017.01) |
| *H01L 27/11551* | (2017.01) |

(52) U.S. Cl.
CPC .. *H01L 27/11578* (2013.01); *H01L 27/11519* (2013.01); *H01L 27/11526* (2013.01); *H01L 27/11551* (2013.01); *H01L 27/11565* (2013.01); *H01L 27/11573* (2013.01)

(58) Field of Classification Search
CPC ......... H01L 27/11578; H01L 27/11519; H01L 27/11526; H01L 27/11551; H01L 27/11565; H01L 27/11573; H01L 27/11582; H01L 27/11524; H01L 27/11529; H01L 27/11531; H01L 27/11556; H01L 27/1157; G03F 1/76
See application file for complete search history.

(56) References Cited

U.S. PATENT DOCUMENTS

| | | | |
|---|---|---|---|
| 10,475,806 B2 | 11/2019 | Yagi et al. | |
| 10,804,283 B2 | 10/2020 | He et al. | |
| 2010/0040983 A1* | 2/2010 | Ollendorf | G03F 1/72 430/319 |
| 2015/0263026 A1* | 9/2015 | Kono | H01L 21/76804 257/314 |
| 2018/0053780 A1 | 2/2018 | Oh et al. | |
| 2018/0269221 A1 | 9/2018 | Oda et al. | |
| 2018/0337140 A1 | 11/2018 | Luoh et al. | |
| 2019/0013327 A1 | 1/2019 | He et al. | |

(Continued)

FOREIGN PATENT DOCUMENTS

| | | |
|---|---|---|
| TW | 200733400 A | 9/2007 |
| TW | 201322375 A1 | 6/2013 |

(Continued)

*Primary Examiner* — Allison Bernstein
(74) *Attorney, Agent, or Firm* — Oblon, McClelland, Maier & Neustadt, L.L.P.

(57) ABSTRACT

A semiconductor device of an embodiment includes first and second structures arranged in a first hierarchy, in which the first and second structures are repeatedly arranged in a first direction along a plane of the first hierarchy, and a distance between geometric centers of the first and second structures in a minimum unit of repetition of the first and second structures differs between a first position and a second position in the first direction.

18 Claims, 10 Drawing Sheets

(56) References Cited

U.S. PATENT DOCUMENTS

| | | |
|---|---|---|
| 2019/0081017 A1 | 3/2019 | Nakajima |
| 2019/0081073 A1 | 3/2019 | Kim. et al. |
| 2019/0287894 A1 | 9/2019 | Nakajima et al. |
| 2020/0075481 A1 | 3/2020 | Yoshimori et al. |
| 2021/0151458 A1 | 5/2021 | He et al. |

FOREIGN PATENT DOCUMENTS

| | | |
|---|---|---|
| TW | 201842654 A | 12/2018 |
| WO | WO 2013/028376 A2 | 2/2013 |

* cited by examiner

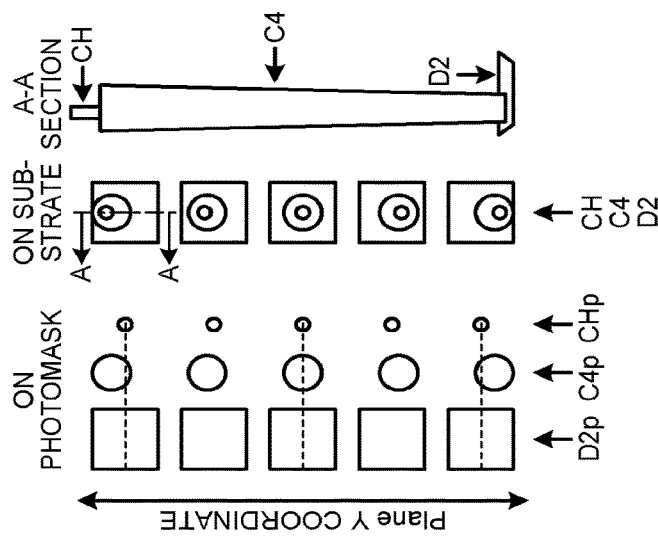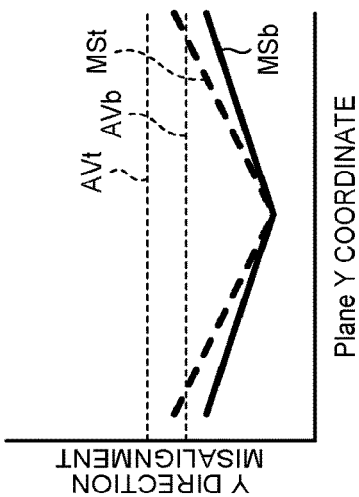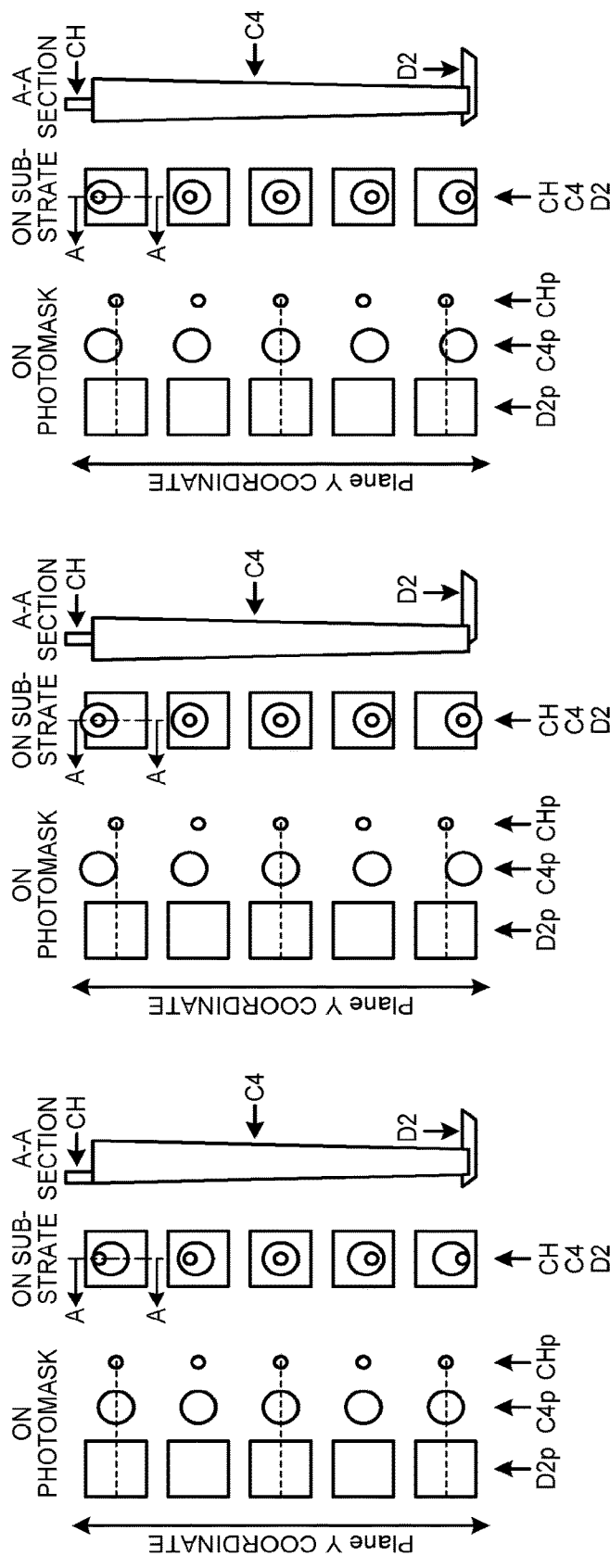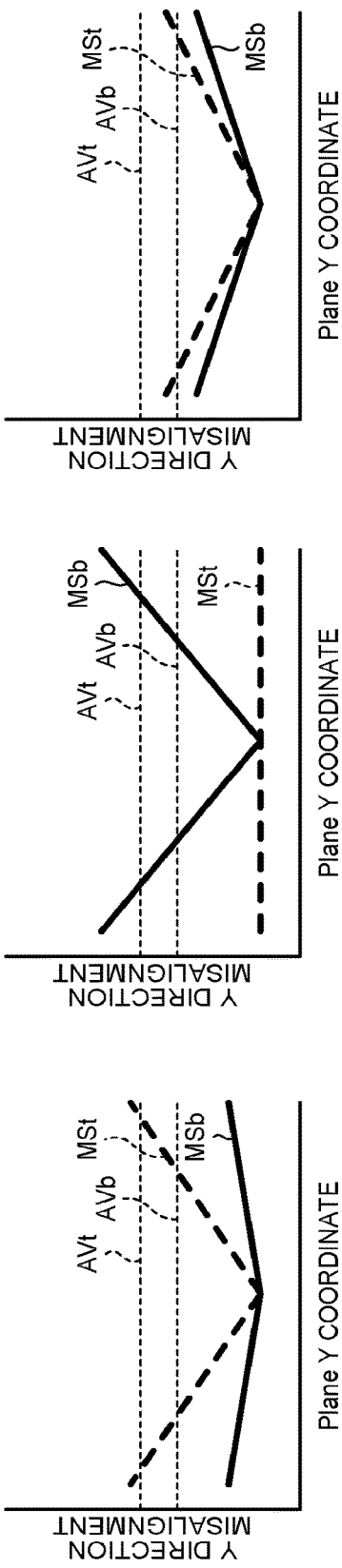

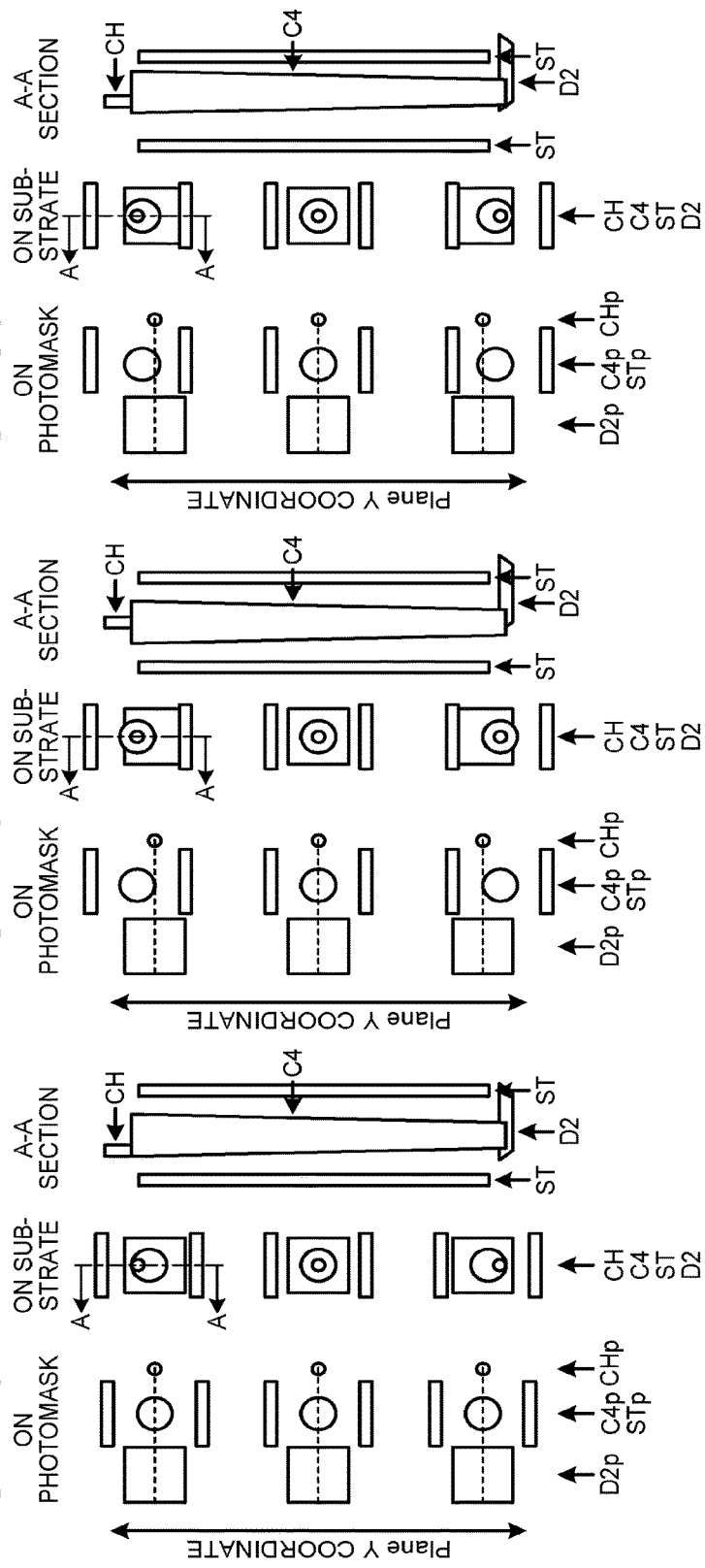

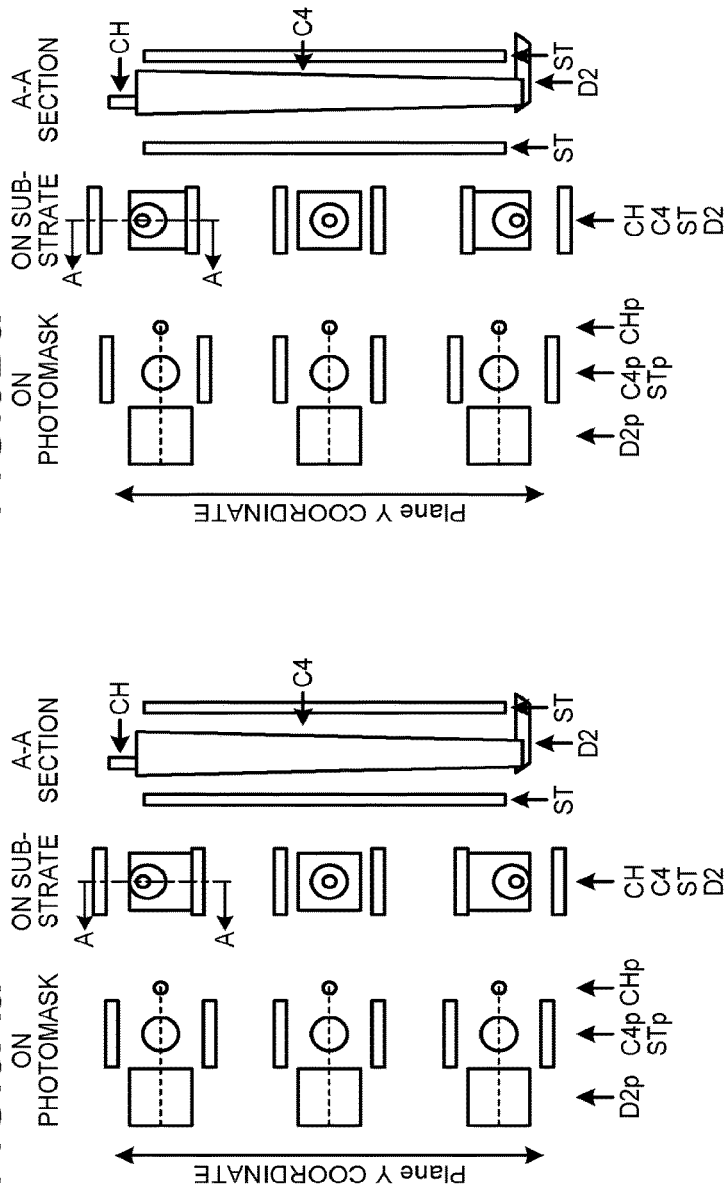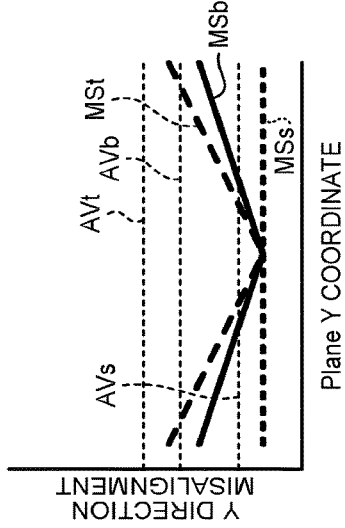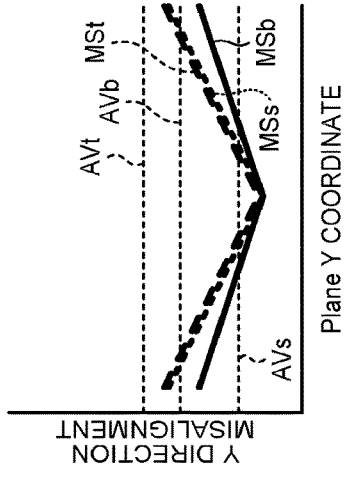

SEMICONDUCTOR DEVICE AND PHOTOMASK

CROSS-REFERENCE TO RELATED APPLICATIONS

This application is based upon and claims the benefit of priority from Japanese Patent Application No. 2020-141795, filed on Aug. 25, 2020; the entire contents of which are incorporated herein by reference.

FIELD

Embodiments described herein relate generally to a semiconductor device and a photomask.

BACKGROUND

A semiconductor device has, for example, a stacked structure composed of a plurality of hierarchies. Due to the influence of stress in each layer of the semiconductor device, misalignment may occur between the structures arranged in different hierarchies, and poor connection may occur between these structures.

BRIEF DESCRIPTION OF THE DRAWINGS

FIGS. 7Aa to 7Cb are diagrams for describing misalignment correction using a photomask of a second embodiment;
FIGS. 9Aa to 9Bb are diagrams for describing misalignment correction using a photomask of a modification example of the second embodiment.

DETAILED DESCRIPTION

A semiconductor device of an embodiment includes first and second structures arranged in a first hierarchy, in which the first and second structures are repeatedly arranged in a first direction along a plane of the first hierarchy, and a distance between geometric centers of the first and second structures in a minimum unit of repetition of the first and second structures differs between a first position and a second position in the first direction.

Hereinafter, the present invention will be described in detail with reference to the drawings. In addition, the present invention is not limited by the embodiments described below. In addition, the constituents in the following embodiments include those that can be easily assumed by those skilled in the art or those that are substantially the same.

First Embodiment

Figure 1A:
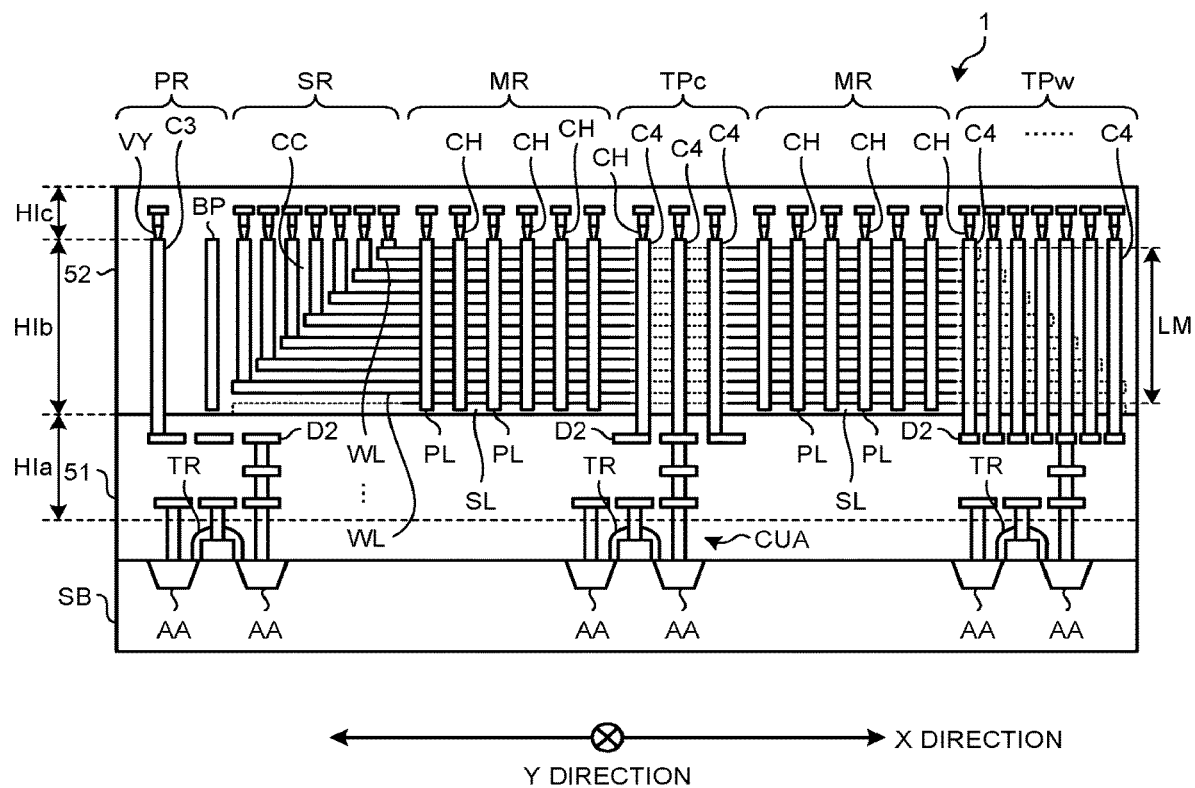
FIGS. 1A and 1B are diagrams illustrating a schematic configuration example of a semiconductor device according to a first embodiment.
Figure 1B:
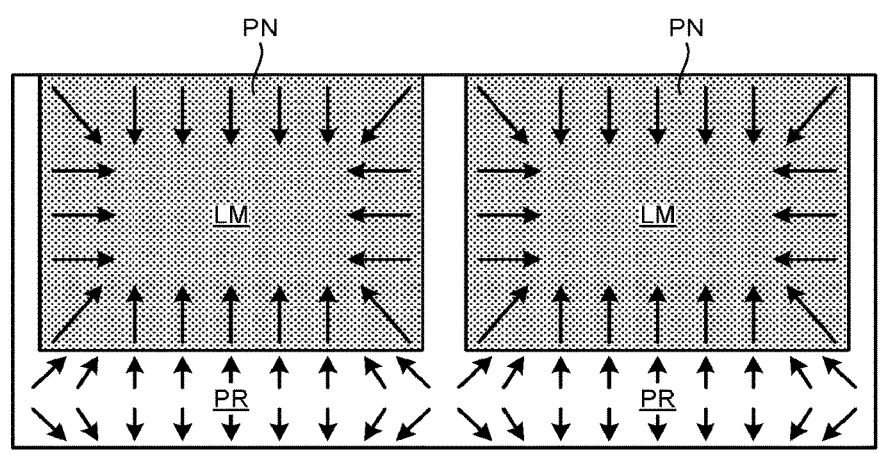

Hereinafter, a first embodiment will be described in detail with reference to the drawings.
    (Configuration Example of Semiconductor Device)
    FIGS. 1A and 1B are diagrams illustrating a schematic configuration example of a semiconductor device 1 according to the first embodiment. FIG. 1A is a sectional view of the semiconductor device 1 along an X direction, and FIG. 1B is a schematic plan view illustrating stress that may be generated in the semiconductor device 1. However, in FIG. 1A, some of upper layer wiring is omitted. Further, structures that are not present on the same section are also illustrated at the same time.

As illustrated in FIG. 1A, the semiconductor device 1 includes a peripheral circuit CUA and a stacked body LM on a substrate SB.

The substrate SB is a semiconductor substrate such as a silicon substrate. The peripheral circuit CUA including transistors TR, contacts, and the like is arranged on the substrate SB. The transistors TR are arranged on active areas AA provided on a surface layer of the substrate SB. The peripheral circuit CUA is arranged below a memory region MR in which a plurality of memory cells are arranged, and contributes to the operation of the memory cells as will be described later.

The peripheral circuit CUA is covered with an insulating layer 51. Source lines SL are arranged in a partial region on the insulating layer 51. Further, the stacked body LM in which a plurality of word lines WL are stacked with the insulating layer interposed therebetween is arranged in a partial region on the insulating layer 51 via the source lines SL.

The stacked body LM includes memory regions MR, penetrating contact regions TPc and TPw, and a staircase region SR.

The memory regions MR are arranged in the vicinity of the center of the stacked body LM, for example. In the memory region MR, a plurality of pillars PL that penetrate the word lines WL in a stacking direction to reach the source line SL are arranged. A plug CH for connecting the pillar PL and an upper layer wiring such as a bit line is arranged at the upper end portion of the pillar PL. A plurality of memory cells are formed at intersections of the pillars PL and the word lines WL. Data is read and written from and to the memory cells by applying a predetermined voltage to the memory cells which are electrically connected to the corresponding word line WL from the word line WL, or the like.

In this way, the semiconductor device 1 is configured as, for example, a three-dimensional non-volatile memory in which memory cells are three-dimensionally arranged in the memory region MR.

The word lines WL are terminated stepwise at both end portions of the stacked body LM in the X direction. One end side of the word lines WL is the staircase region SR, and the other end side thereof is a penetrating contact region TPw.

The staircase region SR has a configuration in which the plurality of word lines WL are led out in a staircase pattern. A contact CC that connects the word line WL and the upper layer wiring or the like is arranged on a terrace portion of each of the plurality of word lines WL led out in staircase pattern, and the contact CC is configured to be able to apply a predetermined voltage to the memory cells via the word lines WL.

In this specification, a direction in which a terrace surface of each staircase of the staircase region SR faces is defined as an upward direction in the semiconductor device 1.

Each of the penetrating contact region TPw arranged on the other end side of the stacked body LM in the X direction and the penetrating contact region TPc arranged between the memory regions MR of the stacked body LM includes an insulating region having no word line WL.

The word line WL of the stacked body LM is a layer formed by replacing a sacrificial layer made of an insulating material or the like with a conductive material. When the material is replaced, insulating regions such as the penetrating contact regions TPw and TPc are formed by inhibiting the replacement of the material in partial regions. In those insulating regions, contacts C4 that connect the peripheral circuit CUA arranged on the substrate SB on the lower side and various kinds of upper layer wiring and the like are arranged.

More specifically, a wiring D2 that is electrically connected to the peripheral circuit CUA via a plurality of contacts and wiring or the like is connected to the lower end of the contact C4. The plug CH that is electrically connected to the upper layer wiring or the like is connected to the upper end of the contact C4.

A peripheral region PR is arranged around the stacked body LM. The peripheral region PR is covered with an insulating layer 52 having a thickness that reaches at least the height of the upper surface of the stacked body LM. However, a contact C3 that connects the peripheral circuit CUA and the upper layer wiring or the like is also arranged in the peripheral region PR.

More specifically, the wiring D2 that is electrically connected to the peripheral circuit CUA via a plurality of contacts and wiring or the like is connected to the lower end of the contact C3. A plug VY that is electrically connected to the upper layer wiring or the like is connected to the upper end of the contact C3.

Further, a plate-like portion BP in which a groove for relaxing the stress acting between the peripheral region PR and the stacked body LM is filled with an insulating layer or the like may be arranged in the peripheral region PR. The plate-like portion BP penetrates the insulating layer 52 in a thickness direction and extends in a Y direction. In the semiconductor device 1 in the middle of manufacturing, the plate-like portion BP, which is a groove before being filled with the insulating layer, separates the peripheral region PR from the stacked body LM, so that the stress from the peripheral region PR to the stacked body LM is relaxed.

FIG. 1B illustrates a stress distribution in planes PN of the semiconductor device 1. The plane PN contains, for example, at least one stacked body LM, and includes each configuration belonging to the memory regions MR, the staircase region SR, and the penetrating contact regions TPc and TPw excluding the peripheral circuit CUA, among the minimum configuration capable of functioning as a storage circuit independently. Here, the wirings D2 connected to the contacts C4 of the penetrating contact regions TPc and TPw may also be included in the plane PN. The semiconductor device 1 may include one or a plurality of planes PN. In a case where the semiconductor device 1 includes a plurality of planes PN, these planes PN can operate in parallel.

As illustrated in FIG. 1B, stress may be generated between the peripheral region PR and the plane PN due to the differences in structures and materials constituting the peripheral region PR and the plane PN. For example, at least in the stacked body LM including the sacrificial layer before being replaced with the word line WL, compressive stress toward the center of the stacked body LM is generated as indicated by inward arrows in FIG. 1B. On the other hand, in the peripheral region PR in which the thick insulating layer 52 is arranged, tensile stress toward the outside from the center of the peripheral region PR is generated as indicated by outward arrows in FIG. 1B.

Due to the influence of such stress, the various structures illustrated in FIG. 1A may be misaligned from the desired formation position. Further, for example, in the contacts C3 and C4 and the like connecting the structures between a plurality of different hierarchies, poor connection may occur at one or both of the connection with the wiring D2 on the lower layer and the connection with the plugs VY and CH on the upper layer.

In the example of FIG. 1A, the different hierarchies include, for example, a hierarchy HIb as a first hierarchy including the stacked body LM, a hierarchy HIa as a second hierarchy which is positioned below the hierarchy HIb, is interposed between a hierarchy including the peripheral circuit CUA and the hierarchy HIb, and is composed of the insulating layer 51 including the wiring D2, and a hierarchy HIc as a third hierarchy which is an upper layer of the hierarchy HIb including the stacked body LM and includes the plugs VY and CH and the like.

Further, the minimum configuration capable of independently functioning as a storage circuit, or more broadly, a semiconductor circuit as described above is the configuration illustrated in FIG. 1A, taking the semiconductor device 1 of the first embodiment as an example. That is, FIG. 1A includes the memory regions MR in which the memory cells are arranged, the peripheral circuit CUA contributing to the operation of those memory cells, and various kinds of wiring including the word lines WL, contacts C4 and C3, and the like which electrically connect the memory cells and the peripheral circuit CUA. With these configurations, the configuration illustrated in FIG. 1A can be the minimum configuration capable of independently functioning as a semiconductor circuit. The configuration illustrated in FIG. 1A is also referred to as an independent operating element in the semiconductor device 1 of the first embodiment. The semiconductor device 1 of the first embodiment includes at least one independent operating element.

The structure of the first embodiment can be applied to, for example, the connection structure with the contacts C4, the wirings D2, and the plugs CH in the penetrating contact regions TPc and TPw, and the connection structure with the contacts C3, the wirings D2, and the plugs VY in the peripheral region PR described above. Hereinafter, the connection structure with the contacts C4, the wirings D2, and the plugs CH in the penetrating contact region TPc will be described as an example.

(Example of Misalignment Correction of Semiconductor Device)

Figure 2:
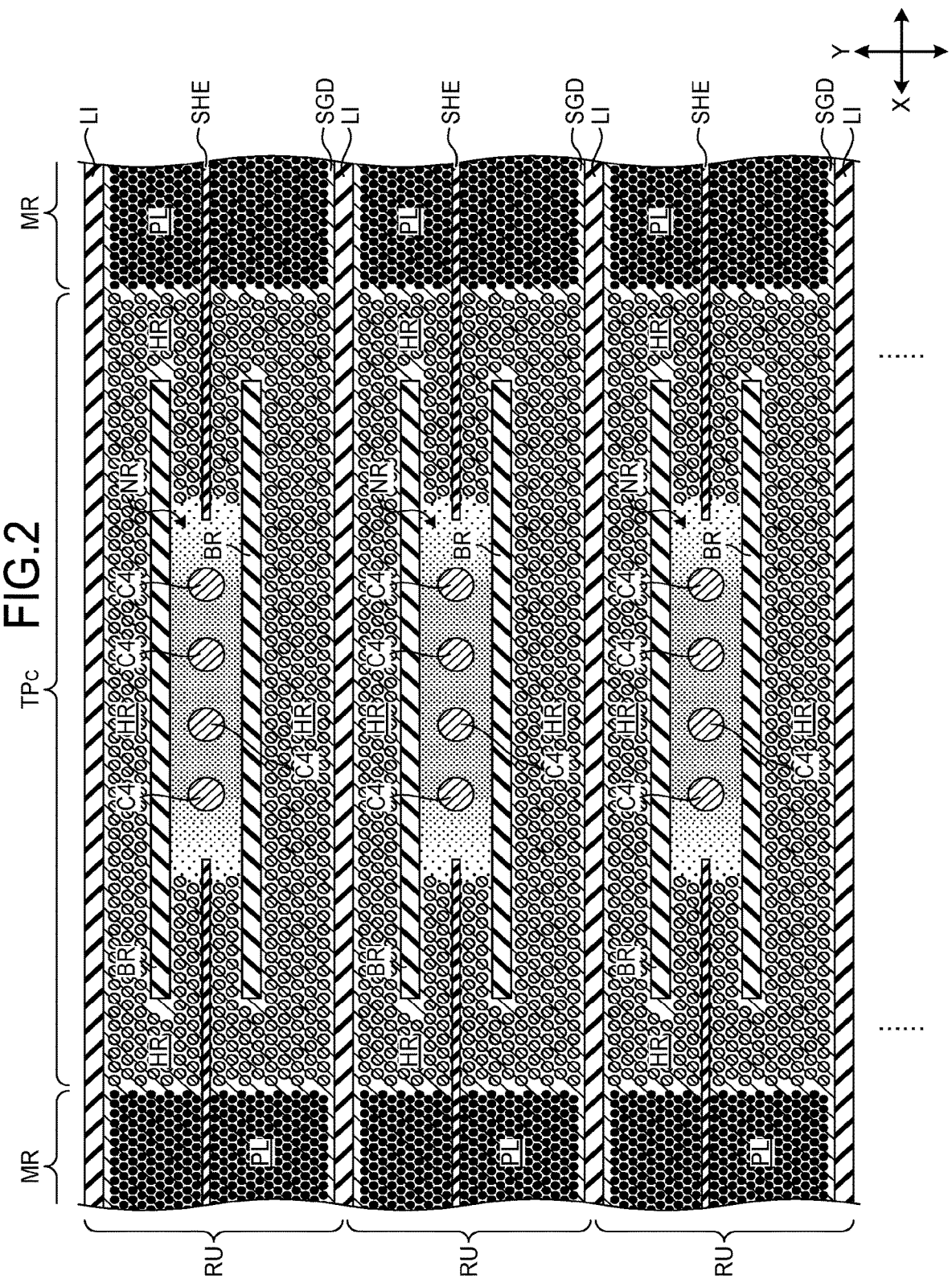
FIG. 2 is a horizontal sectional view of a region including a penetrating contact region of the semiconductor device according to the first embodiment.

FIG. 2 is a horizontal sectional view of a region including the penetrating contact region TPc of the semiconductor device 1 according to the first embodiment. As illustrated in FIG. 2, the region including the penetrating contact region TPc constitutes a plurality of minimum units RU in which the contacts C4 as a first structure are repeatedly arranged in the Y direction.

One minimum unit RU is interposed between two contacts LI as a second structure that are at both end portions in the Y direction, and includes the contacts C4, plate-like portions BR, and columnar portions HR which are arranged in the penetrating contact region TPc, the pillars PL arranged in the memory region MR, and separation layers SHE arranged in the penetrating contact region TPc and the memory regions MR. Although not illustrated in FIG. 2, the minimum unit RU also includes the wirings D2 as a third structure and the plugs CH as a fourth structure which are connected to the contacts C4. In addition, the two contacts LI that partition one minimum unit RU may be included in the minimum unit RU.

The contact LI has a longitudinal direction in the X direction, and has a structure in which a slit that penetrates the stacked body LM to reach the source line SL is filled with a conductive layer having a liner of an insulating layer. The slits where the contacts LI are formed separate the stacked body LM in the Y direction to form a block in the plane PN of the semiconductor device 1. In the semiconductor device 1 at the time of manufacturing, the sacrificial layer of the stacked body LM is removed by a removal liquid or the like through the slit before being filled with the conductive layer. Further, a conductive material gas is supplied into the gap obtained by the removal of the sacrificial layer of the stacked body LM, through the slit so that the word line WL is formed.

The conductive layer of the contact LI is connected to the upper layer wiring or the like via the plug CH. Here, the plug CH connected to the contact LI may be referred to as the plug CH as a fifth structure, and may be distinguished from the plug CH as the fourth structure connected to the contact C4 described above. Further, the plug CH connected to the pillar PL may be referred to as the plug CH as a sixth structure and may be distinguished from other plugs CH.

As described above, in the semiconductor device 1 after manufacturing, the contact LI functions as a source line contact by the structure connected to the upper layer wiring or the like. However, instead of the contact LI, a structure that is not connected to the plug CH and does not function as a source line contact may be formed by filling the slit with the insulating layer or the like.

The separation layer SHE that separates one or a plurality of conductive layers including at least the uppermost conductive layer among the conductive layers formed in the stacked body LM by the replacement with the sacrificial layer is arranged between the two contacts LI. The separation layer SHE extends in the X direction, and partitions one or a plurality of conductive layers of the stacked body LM into a pattern of select gate lines SGD arranged on both sides of the separation layer SHE in the Y direction.

That is, the select gate line SGD is arranged on the upper layer of the plurality of word lines WL of the stacked body LM. The select gate line may also be arranged on a lower layer of the plurality of word lines WL of the stacked body LM. FIG. 2 illustrates a horizontal section of the stacked body LM at the height position of the select gate line SGD.

Select gates (not illustrated) are formed at the intersections of pillars PL and the select gate lines SGD on the upper layer and the select gate lines on the lower layer, and by turning these select gates on or off, the memory cells of the pillars PL to which these select gates belong are selected or unselected.

As described above, the contact C4 is arranged in an insulating region NR including the sacrificial layer of which the replacement with the conductive material is inhibited. In the example of FIG. 2, a plurality of contacts C4 arranged in the X direction are arranged within the insulating region NR. However, a plurality of contacts C4 may be arranged in the Y direction instead of or in addition to the X direction.

The plate-like portion BR that inhibits the replacement of the sacrificial layer with the word line WL or the like is arranged at each of both end portions of the insulating region NR in the Y direction. The plate-like portion BR has a longitudinal direction in the X direction, and penetrates the stacked body LM to reach the source line SL. The inside of the plate-like portion BR is filled with an insulating layer.

By such a structure, when the sacrificial layer is replaced with the word line WL or the like, the plate-like portion BR inhibits the inflow of the removal liquid of the sacrificial layer and the conductive material gas from the slit to the insulating region NR, and the insulating region NR is secured in a partial region of the stacked body LM. By arranging the contact C4 in the insulating region NR, for example, it is possible to suppress the occurrence of electrical conduction between the contact C4 and the word line WL.

A plurality of columnar portions HR are arranged in the penetrating contact region TPc excluding the insulating region NR. The columnar portion HR penetrates the stacked body LM to reach the source line SL. The inside of the columnar portion HR is filled with, for example, an insulating layer or the like.

As described above, when the sacrificial layer is replaced with the word line WL or the like, the stacked body LM has a fragile structure having a gap between the insulating layers. At this time, the columnar portion HR functions as a support for supporting the stacked body LM in the penetrating contact region TPc. In addition, the plurality of columnar portions HR may be arranged in the above-described staircase region SR, and these columnar portions HR may function as supports for supporting the staircase region SR. The arrangement of the columnar portions HR may be an orthogonal lattice-like (matrix-like) or staggered periodic arrangement, an arrangement in which a part of the above-described periodic arrangement is missing, an arrangement of which the period is partially different from the above-described periodic arrangement, or the like.

As described above, the plurality of pillars PL are arranged in the memory regions MR. The memory cells are formed at the intersections of the plurality of pillars PL and the plurality of word lines WL, and when the sacrificial layer is replaced with the word line WL or the like, the pillars PL function as supports for supporting the stacked body LM in the memory regions MR. The arrangement of the pillars PL is a two-dimensional periodic lattice-like arrangement. From the viewpoint of the accumulation density of memory cells, the staggered arrangement is efficient as the arrangement of pillars PL.

The above-described configuration is formed by, for example, forming a photoresist film or the like having a pattern of each structure on the stacked body LM a plurality of times, and repeating a process of transferring the pattern to the stacked body LM. The pattern formation on the photoresist film or the like is performed by, for example, applying an exposure light through a photomask to expose a part of the photoresist film or the like to light.

FIGS. 3Aa to 3Cb are diagrams for describing the misalignment correction using the photomask of the first embodiment.

FIG. 3Aa is a diagram schematically illustrating a top view of photomasks without misalignment correction, and a top view and a sectional view of each structure formed in a case of using the photomasks. In FIG. 3Aa, the top views of the photomasks and each structure schematically illustrate a state of one end portion in the Y direction within the plane PN, an intermediate position between the one end portion and a center portion within the plane PN, the center portion within the plane PN, an intermediate position between the center portion and the other end portion within the plane PN, and the other end portion in the Y direction within the plane PN, from the upper side in the vertical direction.

As illustrated in FIG. 3Aa, wiring patterns D2p on the photomask for forming the wirings D2 are arranged at substantially equal intervals in the Y direction in one plane PN. Similarly, contact patterns C4p on the photomask for forming the contacts C4 and plug patterns CHp on the photomask for forming the plugs CH are also arranged at substantially equal intervals in the Y direction in one plane PN.

Further, on these photomasks, the interval between the wiring patterns D2p, the interval between the contact patterns C4p, and the interval between the plug patterns CHp are substantially equal. Therefore, when these photomasks are superposed, the positions of the geometric centers of the wiring pattern D2p, the contact pattern C4p, and the plug pattern CHp substantially match at any position in the Y direction within the plane PN.

However, when these photomasks are used to sequentially form the wirings D2, the contacts C4, and the plugs CH on the substrate SB, the misalignment amount in the wirings D2, the contacts C4, and the plugs CH is increased as being toward both end portions of the plane PN in the Y direction.

This is because the stress acting within the plane PN changes in each of the hierarchies HIa to HIc while the wirings D2, the contacts C4, and the plugs CH are sequentially formed, and the structures formed at equal intervals are misaligned. As a result, the intervals between the patterns which were equal to each other in the photomask, become different between the structures on the actual substrate SB. Therefore, the positions of the geometric centers between the structures do not match.

In the example of FIG. 3Aa, on the substrate SB, the stress is canceled in the vicinity of the center in the Y direction within the plane PN, and the positions of the geometric centers of the wiring D2, the contact C4, and the plug CH substantially match. However, the interval between the contacts C4 is increased more than the interval between the wirings D2, and the interval between the plugs CH is increased more than the interval between the contacts C4. Therefore, the distance between the geometric centers of the contact C4 and the wiring D2 and the distance between the geometric centers of the contact C4 and the plug CH are both increased as being toward both end portions in the Y direction within the plane PN.

Referring to the A-A section of one end portion of the plane PN in the Y direction, the contact C4 is connected to the wiring D2 at a position shifted outward in the Y direction from the center position of the wiring D2, and the plug CH is barely connected to the end portion of the contact C4 on the outer side in the Y direction.

FIG. 3Ab is a graph schematically illustrating the misalignment amount of each structure in a case of using the photomasks without misalignment correction. The horizontal axis of the graph is the Y coordinate position in the plane PN, and the vertical axis is the misalignment amount in the Y direction.

As illustrated in FIG. 3Ab, in the vicinity of the center in the Y direction within the plane PN, the positions of the geometric centers of the wiring D2, the contact C4, and the plug CH substantially match, and therefore a misalignment amount MSb between the contact C4 and the wiring D2 and a misalignment amount MSt between the contact C4 and the plug CH both have the lowest value.

However, the misalignment amounts MSb and MSt are both increased as being toward both end portions in the Y direction within the plane PN. Therefore, although the misalignment amount MSb remains within a designed tolerance AVb of the misalignment amount MSb, the misalignment amount MSt deviates from a designed tolerance AVt of the misalignment amount MSt at both end portions in the Y direction.

FIG. 3Ba is a diagram schematically illustrating a top view of photomasks in which the misalignment of the contacts C4 with respect to the plugs CH is 100% corrected, and a top view and a sectional view of each structure formed in a case of using the photomasks.

As illustrated in FIG. 3Ba, the wiring patterns D2p on the photomask for forming the wirings D2 and the plug patterns CHp on the photomask for forming the plugs CH are arranged at substantially equal intervals in the Y direction in one plane PN. Further, on these photomasks, the interval between the wiring patterns D2p, and the interval between the plug patterns CHp are substantially equal.

On the other hand, the contact patterns C4p on the photomask for forming the contacts C4 are 100% corrected according to the positions of the plugs CH on the substrate SB in the actual semiconductor device 1. In this case, the correction amount of the contact patterns C4p is set to substantially match the misalignment amount between the contact C4 and the plug CH in a case where correction is not performed.

The position of the plug CH may be determined on the basis of design data, and may be estimated on the basis of a statistical value obtained from the prototype or the like of the semiconductor device 1 or a simulation value considering the stress that may occur in the semiconductor device 1, as needed.

By 100% correcting the contact patterns C4p to the positions of the plugs CH, the interval between the contact patterns C4p on the photomask is increased as being toward the positions corresponding to both sides of the plane PN in the Y direction more than the interval between the wiring patterns D2p and the interval between the plug patterns CHp on other photomasks.

In this manner, when these photomasks are superposed, the positions of the geometric centers of the wiring patterns D2p and the plug patterns CHp substantially match at any position in the Y direction within the plane PN, and only the positions of the geometric centers of the contact patterns C4p are shifted outward in the Y direction as being toward both sides in the Y direction within the plane PN.

When these photomasks are used to sequentially form the wirings D2, the contacts C4, and the plugs CH on the substrate SB, since the positions of the contacts C4 are adjusted to match the positions of the plugs CH, the plug CH is connected to the substantially center position of the contact C4 over the entire position in the Y direction within the plane PN.

However, since the contacts C4 are arranged outward in accordance with the plugs CH, the misalignment amount between the contact C4 and the wiring D2 is increased as being toward both end portions of the plane PN in the Y direction.

Referring to the A-A section of one end portion of the plane PN in the Y direction, although the plug CH is connected to the substantially center position of the contact C4, a part of the lower end of the contact C4 deviates to the outside of the wiring D2 in the Y direction.

FIG. 3Bb is a graph schematically illustrating the misalignment amount of each structure in a case of using the photomasks in which the misalignment of the contacts C4 with respect to the plugs CH is 100% corrected.

As illustrated in FIG. 3Bb, the misalignment amount MSt between the contact C4 and the plug CH has the lowest value over the entire position in the Y direction in the plane PN. However, the misalignment amount MSb between the contact C4 and the wiring D2 is increased as being toward both end portions in the Y direction within the plane PN, and greatly deviates from the designed tolerance AVb of the misalignment amount MSb at both end portions in the Y direction.

FIG. 3Ca is a diagram schematically illustrating a top view of photomasks in which the misalignment of the contacts C4 with respect to the plugs CH is 40% corrected, and a top view and a sectional view of each structure formed in a case of using the photomasks.

As illustrated in FIG. 3Ca, the wiring patterns D2$p$ on the photomask for forming the wirings D2 and the plug patterns CHp on the photomask for forming the plugs CH are arranged at substantially equal intervals in the Y direction in one plane PN, and the interval between the wiring patterns D2$p$ and the interval between the plug patterns CHp are substantially equal.

On the other hand, the contact patterns C4$p$ on the photomask for forming the contacts C4 are arranged at positions which are corrected to the positions of the plugs CH on the substrate SB in the actual semiconductor device 1 with a correction factor of less than 100%.

By correcting the contact patterns C4$p$ to the positions of the plugs CH by less than 100%, the interval between the contact patterns C4$p$ on the photomask is smaller than that in the case of the above-described 100% correction and is increased more than the interval between the wiring patterns D2$p$ and the interval between the plug patterns CHp on other photomasks, as being toward both end portions of the plane PN in the Y direction.

In the example of FIG. 3Ca, the correction factor of the contact pattern C4$p$ with respect to the plug CH is set to, for example, 40%. In a case where the contact pattern C4$p$ is corrected with respect to the plug CH by, for example, 40%, the correction amount of the contact patterns C4$p$ is set to be 40% of the misalignment amount between the contact C4 and the plug CH in a case where correction is not performed.

Among the photomasks for forming the contacts C4 illustrated in FIGS. 3Aa, 3Ba, and 3Ca, the photomask illustrated in FIG. 3Ca corresponds to the photomask of the first embodiment.

When these photomasks illustrated in FIG. 3Ca are used to sequentially form the wirings D2, the contacts C4, and the plugs CH on the substrate SB, although the center positions of the contacts C4 and the plugs CH are not perfectly aligned over the entire position in the Y direction within the plane PN, it is possible to avoid that the contact C4 greatly deviates from the wiring D2.

Referring to the A-A section of one end portion of the plane PN in the Y direction, the plug CH is connected to a position slightly shifted outward in the Y direction from the center position of the contact C4, and the entire lower end of the contact C4 is connected to the wiring D2.

FIG. 3Cb is a graph schematically illustrating the misalignment amount of each structure in a case of using the photomasks in which the misalignment of the contacts C4 is 40% corrected.

As illustrated in FIG. 3Cb, both the misalignment amount MSb between the contact C4 and the wiring D2 and the misalignment amount MSt between the contact C4 and the plug CH are respectively within the tolerance AVb and the tolerance AVt, over the entire position in the Y direction within the plane PN.

In this way, instead of perfectly aligning the contacts C4 with respect to the plugs CH by the 100% correction, by aligning the contacts C4 with respect to the plugs CH by a predetermined correction factor of less than 100%, both the misalignment amount between the contact C4 and the wiring D2 and the misalignment amount between the contact C4 and the plug CH can be kept within the tolerance.

In addition, in FIGS. 3Ab, 3Bb, and 3Cb described above, the change in misalignment amount between the structures in the Y direction is represented by a linear graph, but each of the graphs is merely a schematic graph. Therefore, the misalignment amount between the structures is not always changed linearly, and even in such a case, the above correction method can be used.

The method of performing the correction by less than 100% described above will be described in more detail.

In the above description, the description has been focused on the misalignment correction in the Y direction within the plane PN, but the above method can also be applied to the misalignment correction in the X direction. Therefore, in the following, a correction amount $\Delta d(x,y)$ in a case where the contact C4 is corrected with respect to the position (x,y) of the plug CH, which is represented by the X coordinate and the Y coordinate within the plane PN, by a predetermined ratio $\alpha$ ($\alpha<1$) of less than 100% will be described.

Here, the ratio $\alpha$ is determined on the basis of, for example, the misalignment amount between the contact C4 and the wiring D2 on the actual substrate SB, the misalignment amount between the contact C4 and the plug CH on the actual substrate SB, the value of the tolerance of each of the misalignment amounts, and the like. In some cases, the misalignment amount, the tendency of misalignment, and the like differ between the X direction and the Y direction in the plane PN. In such a case, different ratios $\alpha$ may be used for the X direction and the Y direction.

Further, in a case where a correction amount $\Delta d_0(x,y)$ in a case where the contact C4 is 100% corrected with respect to the position (x,y) of the plug CH is less than a threshold value $\Delta dth$, it is desirable that the above correction is not implemented. The threshold value $\Delta dth$ is determined on the basis of the value of the designed tolerance of the misalignment amount between the contact C4 and the plug CH, and the like.

In a case where the correction amount $\Delta d_0(x,y)$ at the time of the 100% correction of the contacts C4 with respect to the plugs CH is equal to or greater than the threshold value $\Delta dth$, that is, when $\Delta d_0(x,y) \geq \Delta dth$, the value obtained by multiplying the misalignment amount exceeding the threshold value $\Delta dth$ by the ratio $\alpha$ is defined as the actual correction amount $\Delta d(x,y)$. Specifically, the correction amount $\Delta d(x,y)$ at this time is expressed by, for example, Equation (1) below.

$$\Delta d(x,y) = \Delta dth + \alpha(\Delta d_0(x,y) - \Delta dth) \quad (1)$$

However, Equation (1) described above may be a higher-order equation. More precise correction is possible by obtaining the correction amount $\Delta d(x,y)$ by a higher-order equation.

Figure 3D:
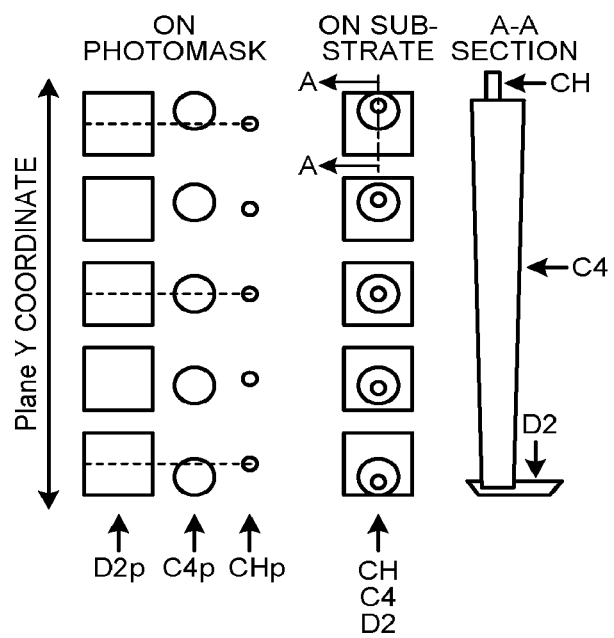
FIGS. 3Aa to 3Db are diagrams for describing misalignment correction using a photomask of the first embodiment.
Figure 3D:
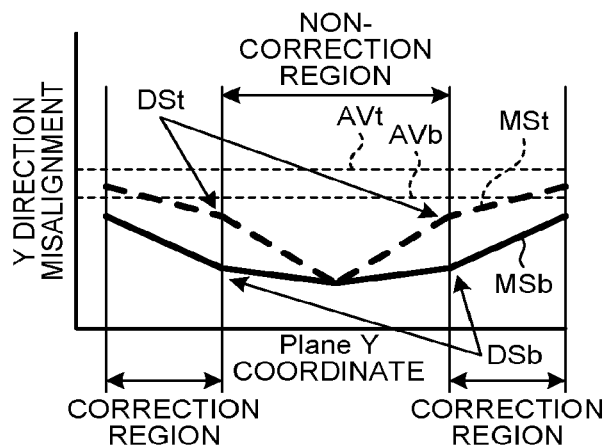

Further, according to Equation (1), there may be a region in which the misalignment correction is performed and a region in which the misalignment correction is not performed within the plane PN, regardless of the example of FIG. 3Cb described above. That is, in a case where a region in which the correction amount $\Delta d_0(x,y)$ at the time of the 100% correction of the contacts C4 with respect to the plugs CH is less than the threshold value Δdth ($\Delta d_0(x,y) < \Delta dth$) is present within the plane PN, the misalignment correction in that region with respect to the contact C4 is not performed. An example is illustrated in FIGS. 3Da and 3Db.

In the example illustrated in FIG. 3Db, a region within a predetermined distance from the center toward the end portions in the Y direction within the plane PN is a region in which the misalignment correction is not performed since the correction amount $\Delta d_0(x,y)$ is less than the threshold value Δdth. As described above, the threshold value Δdth is determined on the basis of, for example, the value of the designed tolerance AVt of the misalignment amount MSt between the contact C4 and the plug CH, and the like. Therefore, in a case where the correction amount $\Delta d_0(x,y)$ is less than the threshold value Δdth, it is possible to suppress that the misalignment amount MSt exceeds the tolerance AVt even in a case where the correction is not performed.

On the other hand, regions from the predetermined distance to the end portions in the Y direction within the plane PN are regions in which the misalignment correction is performed because the correction amount $\Delta d_0(x,y)$ is equal to or greater than the threshold value Δdth. Since the misalignment of the contact C4 with respect to the plug CH is corrected, the inclination of the misalignment amount MSt, which tends to rise from the center to the end portions in the Y direction within the plane PN, becomes gentle. On the other hand, the inclination of a misalignment amount MSb, which also tends to rise from the center to the end portion in the Y direction within the plane PN, becomes steeper. By correcting the misalignment of the contact C4 in this way, as illustrated in FIG. 3Da, the connection between the contact C4 and the plug CH and the connection between the contact C4 and the wiring D2 are secured even at the end portions in the Y direction within the plane PN.

As described above, in a case where both the region in which the misalignment correction is performed and the region in which the misalignment correction is not performed are present within the plane PN, the misalignment amounts MSt and MSb of the contact C4, that is, both the distance between the geometric centers of the contact C4 and the plug CH, and the distance between the geometric centers of the contact C4 and the wiring D2 have discontinuous points DSt and DSb where the change tendency is discontinuous, at the boundary between those regions. These discontinuous points DSt and DSb appear in the vicinity of the positions where the correction amount $\Delta d_0(x,y)$ and the threshold value Δdth are equal ($\Delta d_0(x,y) = \Delta dth$), in the Y direction within the plane PN. However, the discontinuity of the change tendency does not mean that the distance between the geometric centers changes from an increasing tendency to a decreasing tendency, or changes from a decreasing tendency to an increasing tendency. That is, for example, the increase or decrease of the change tendency is reversed at the center position in the Y direction within the plane PN, but the discontinuous point described here does not include such a point.

In addition, in the above description, the positions of the contacts C4 on the lower layer are corrected with respect to the plugs CH on the upper layer, but the positions of the contacts C4 on the upper layer may be corrected with respect to the wirings D2 on the lower layer by a predetermined ratio α.

In a case where the contacts C4 are formed using Equation (1) described above, the semiconductor device 1 of the first embodiment has at least one of the following configurations.

That is, the misalignment amount between the contact C4 and the wiring D2 and the misalignment amount between the contact C4 and the plug CH have a correlation. That is, the misalignment amount between the contact C4 and the wiring D2 and the misalignment amount between the contact C4 and the plug CH are increased together as being toward the outer sides of the plane PN.

In such a case, for example, at two positions in a predetermined direction such as the X direction or the Y direction, a magnitude relationship, a magnitude ratio, and the like comparing the misalignment amounts between the contact C4 and the wiring D2 have a correlation with a magnitude relationship, a magnitude ratio, and the like comparing the misalignment amounts between the contact C4 and the plug CH.

Here, the two positions in the predetermined direction can be arbitrarily selected, and for example, within the plane PN, the center position and the position of the end portion of the plane PN can be selected. However, in a case where two positions are selected across the planes PN, it is assumed that positions other than those corresponding to each other between the planes PN are selected rather than the same positions such as the center positions of the planes PN.

In addition, a predetermined amount of misalignment occurs between the contact C4 and the wiring D2, and between the contact C4 and the plug CH. That is, for example, as illustrated in FIGS. 3Ba and 3Bb, in a case where the contact C4 is 100% corrected with respect to the plug CH, the misalignment amount between the contact C4 and the plug CH should be, for example, substantially zero. On the other hand, in a case where the above correction is performed by less than 100%, both the misalignment amount between the contact C4 and the wiring D2 and the misalignment amount between the contact C4 and the plug CH have a predetermined value other than zero.

Further, as described above, in a case where the correction amount of the contact C4 with respect to the plug CH is 40% or the like and the specific gravity of the alignment accuracy of the contact C4 with respect to the wiring D2 is increased, the misalignment amount between the contact C4 and the wiring D2 is set to be within a more limited range, and the misalignment amount between the contact C4 and the plug CH tends to be increased as being toward the outer sides of the plane PN.

However, the misalignment amount between contact C4 and wiring D2 and the misalignment amount between contact C4 and plug CH may include the misalignment amount due to processes such as overlay (superposing) misalignment between different lithography processes or the like, in addition to the misalignment amount affected by the stress.

The positional relationship between the contact C4 and the wiring D2, the positional relationship between the contact C4 and the plug CH, and the like described above may be the positional relationships in a case where the upper end of the contact C4, the upper surface of the wiring D2, and the upper end of the plug CH are compared.

In addition, within one minimum unit RU, in a case where a plurality of structures are arranged in one minimum unit RU as in a case where a plurality of contacts C4 are arranged not only in the X direction but also in the Y direction, the position of the geometric center described above may be the position of the geometric center in the entirety of the plurality of structures thereof.

Further, in a case where the contacts C4 are formed using Equation (1) in the above-described correction method, the photomask of the first embodiment has, for example, the configuration illustrated in FIGS. 4A and 4B below.

Figure 4A:
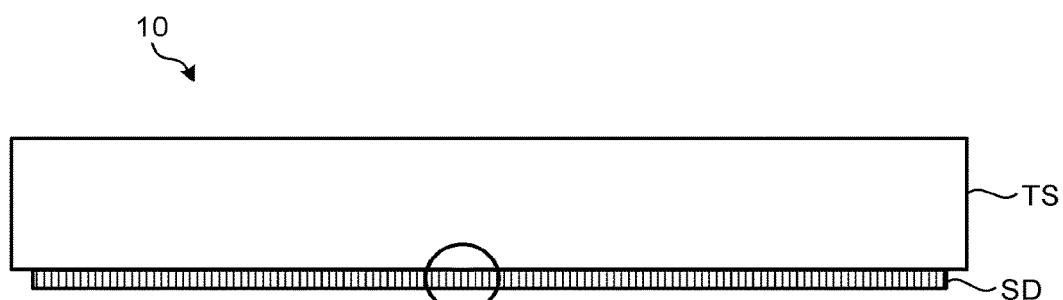
FIGS. 4A and 4B are schematic views illustrating an example of the configuration of the photomask used in forming contacts of the semiconductor device according to the first embodiment.
Figure 4B:
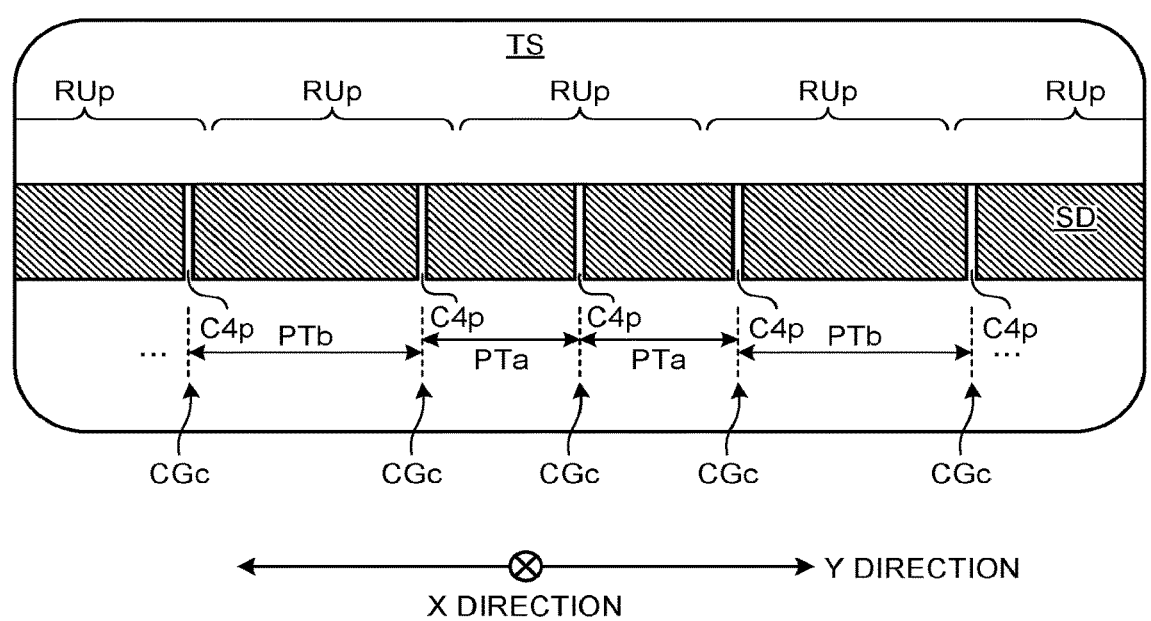

FIGS. 4A and 4B are schematic views illustrating an example of the configuration of a photomask 10 used in forming the contacts C4 of the semiconductor device 1 according to the first embodiment. FIG. 4A is a sectional view of the photomask 10 along the Y direction, and FIG. 4B is a partially enlarged sectional view of the photomask 10. The Y direction in FIGS. 4A and 4B coincides with the Y direction of the above-described semiconductor device 1.

As illustrated in FIG. 4A, the photomask 10 includes a transparent substrate TS as a mask substrate, and an opaque film SD formed on the transparent substrate TS. When the photomask 10 is used, the surface of the transparent substrate TS on which the opaque film SD is formed is directed toward the photoresist film on the substrate SB, and then the exposure light is applied from the transparent substrate TS side.

The transparent substrate TS is made of, for example, quartz. Here, the "transparent" means that it is transparent to at least light having a wavelength of the exposure light, and more specifically, means that the exposure light can be transmitted to such an extent that the photoresist film or the like is sufficiently exposed to light.

The opaque film SD is composed of, for example, chromium or the like, and blocks the exposure light to an extent that the photoresist film or the like is not exposed to light.

As illustrated in FIG. 4B, the opaque film SD of the photomask 10 has a plurality of contact patterns C4p as the first pattern arranged in the Y direction. Each contact pattern C4p has a sectional shape of the contact C4 described above, and is a through-hole provided in the opaque film SD. The photoresist film formed on the stacked body LM is irradiated with the exposure light through the through-hole, and the photoresist film in that portion is exposed to light and removed. By performing etching processing on the stacked body LM exposed by the photoresist film or the like being removed, holes for forming the contacts C4 are formed in the stacked body LM.

FIG. 4B illustrates a section of the photomask 10 corresponding to a portion in the vicinity of the center of, for example, one plane PN, that is, one stacked body LM in the Y direction. Within one plane PN, a plurality of contact patterns C4p of the opaque film SD are also arranged in the Y direction with a predetermined distance in correspondence with the fact that a plurality of minimum units RU arranged in the Y direction each have one contact C4 in the Y-direction section. Each region including one contact pattern C4p and corresponding to the region between the two contacts LI on the substrate SB is a minimum unit RUp in the photomask 10.

Here, the distance between the geometric center CGc, which is the center point of one contact pattern C4p, and the geometric center CGc of the contact pattern C4p adjacent to the one contact pattern C4p, that is, the distances PTa, PTb, . . . between the geometric centers of the adjacent contact patterns C4p are increased as being toward the outer sides in the Y direction within the region of the photomask 10 corresponding to one plane PN. That is, PTa< PTb< . . . .

According to Equation (1) described above, the correction amount $\Delta d(x,y)$ on the photomask 10 includes a value $\alpha$ ($\Delta d_o(x,y)-\Delta dth$) obtained by multiplying the misalignment amount exceeding the threshold value $\Delta dth$ by the ratio $\alpha$. Further, in the above-described example of FIG. 3Aa, in a case where the misalignment correction is not performed, the interval between the plugs CH is larger than the interval between the contacts C4. Therefore, the correction amount $\Delta d(x,y)$ on the photomask 10 is increased as being toward the outer sides in the Y direction within the plane PN, and the distances PTa, PTb, . . . between the geometric centers have the above-described relationship.

Therefore, in the photomask 10, the distance between the geometric centers of adjacent contact patterns C4p differs between two positions in the Y direction, for example. Here, the two positions in the Y direction can be arbitrarily selected, and as long as the two positions are within a region corresponding to the plane PN of the photomask 10, the center position and the position of the end portion of the region can be selected. However, in a case where two positions are selected in regions across the planes PN, it is assumed that positions other than those corresponding to each other between the regions are selected rather than the same positions such as the center positions of the regions.

Further, in comparison between the photomask for forming the wirings D2 and the photomask for forming the plugs CH with the photomask 10, the distance between the geometric centers of the wiring patterns D2p, the distance between the geometric centers of the plug patterns CHp, and the distance between the geometric centers of the contact patterns C4p on the photomasks are substantially equal in the region in the vicinity of the center position within the plane PN. On the other hand, the distance between the geometric centers of the contact patterns C4p is increased more than the distance between the geometric centers of other patterns as being toward both end portions in the Y direction.

It is obvious to those skilled in the art that the configuration of the first embodiment is not limited to the case of using the above-described binary mask which is a typical photomask for forming the opaque film SD on the transparent substrate TS in photolithography.

In photolithography, a phase shift mask may be used instead of the binary mask. The phase shift mask has a structure in which as an alternative to an opaque film, a translucent film based on an appropriate optical design is formed on a transparent substrate. The phase shift mask may be selected in a case where the exposure process margin of lithography is larger than that of the binary mask by appropriately designing and manufacturing the optical characteristics and film thickness of the translucent film such as the complex refractive index.

Further, extreme ultraviolet (EUV) lithography may be used instead of photolithography that performs exposure using ultraviolet rays or deep ultraviolet rays. The wavelength of current EUV lithography is 13.5 nm in the soft X-ray region, and there is no appropriate transparent substrate. For this reason, EUV lithography uses a reflective photomask that utilizes multiple interference of metal oxide films multi-layer stacked on the transparent substrate. A typical structure is a structure in which an opaque film pattern is formed on a multilayer stacked film of metal oxide films. If necessary, a structure in which the multilayer film is dug between the opaque films may be used. Although a reflective optical system is used as the optical system of the above photomask and the exposure apparatus, EUV lithography is generally treated as one type of photolithography, too.

Further, a nanoimprint lithography (NIL) technology may be used instead of the photolithography technology. In NIL, a mold in which a pattern is dug on the surface is used, and specifically, a curable material is filled between the mold and the substrate and is stamped. The mold is removed after the curable material is cured by light or heat, and a pattern is formed on the substrate surface. The point that the substrate is processed using the cured material pattern as a processing mask is the same as in photolithography and the like.

Further, in electron beam lithography, the drawing data position of each pattern may be corrected according to the purpose of the configuration of the first embodiment.

As described above, in the above description, the binary mask of photolithography can be read as the phase shift mask of photolithography, the reflective photomask of EUV lithography, and the mold of NIL. Further, also in electron beam lithography, the drawing data may be created for the purpose of the configuration of the first embodiment.

In the semiconductor device such as a three-dimensional non-volatile memory, there may be differences in mechanical strength and residual stress between hierarchies, such as a mixture of structures in which a plurality of layers are arranged in a high stack, and the differences may be accumulated. For this reason, for example, due to the distortion depending on the position on a plane within the plane and the change in stress between different lithography processes, misalignment may occur between structures arranged in different hierarchies. In a case where these structures are interconnected, poor connection may occur.

Therefore, in order to suppress the poor connection with the structures arranged in the upper and lower hierarchies, for example, the misalignment correction is performed for the structure arranged in the intermediate layer in accordance with the structure of the upper layer or the structure of the lower layer, in some cases.

However, in a case where the correction is performed for the structure of the intermediate layer in accordance with only the structure of the upper layer or only the structure of the lower layer, the poor connection with the other structure may occur. In a case where the area of the connection surface of the structure of any of the upper and lower layers is increased in order to maintain the connection with both the upper and lower hierarchies, the area of the plane may be increased and the size of the semiconductor device may be increased.

According to the semiconductor device 1 of the first embodiment, in the minimum unit RU, each of the distance between the geometric centers of the contact C4 and the wiring D2 and the distance between the geometric centers of the contact C4 and the plug CH differs between any two positions in the Y direction. That is, according to the semiconductor device 1 of the first embodiment, the position of the contact C4 is corrected with respect to the position of the wiring D2 or the plug CH by a correction factor of less than 100°.

As a result, it is possible to suppress the poor connection between structures arranged in different hierarchies. Further, for example, since the poor connection can be suppressed without increasing the size of the wiring D2 or the like, it is possible to reduce the size of the semiconductor device 1.

In the above-described first embodiment, the above-described method of performing correction by less than 100° has been applied to the connection structure with the contact C4, the wiring D2, and the plug CH in the penetrating contact regions TPc and TPw, the connection structure with the contact C3, the wiring D2, and the plug VY in the peripheral region PR, and the like in the semiconductor device 1. However, the above-described method can be applied to other structures as long as the structure is a structure connected to both the structures arranged in the upper and lower hierarchies.

As an example, examples of other semiconductor devices will be given. In the semiconductor device, a configuration is adopted in which, for example, a stacked body in which word lines are stacked is arranged on the substrate, and the peripheral circuit which is covered with the insulating layer up to the height position of the upper surface of the stacked body is arranged in the same hierarchy as the stacked body, on the outer side of the stacked body, for example. In this case, the above-described method of the first embodiment can be applied to the contact which is formed by penetrating the insulating layer and connects the upper layer wiring and the gate or active area of the transistor included in the peripheral circuit.

Since stress is generated between the insulating layer that the contact penetrates and the stacked body arranged in the same hierarchy, it is possible to suppress the poor connection between the contact and the gate or active area, and the poor connection between the contact and the upper layer wiring by applying the above-described method.

Here, in a case where the structure of the first embodiment is applied to the connection structure arranged in the region outside the plane PN, such as the contact C3 of the semiconductor device 1 and the contact that connects the upper layer wiring and the peripheral circuit of the other semiconductor device, the plane PN in the above description may be read as the above-described independent operating element having a configuration in which the contact C3 arranged in the peripheral region PR, the peripheral circuit CUA, and the like are added to the plane PN.

Further, in the above-described first embodiment, in the penetrating contact regions TPc and TPw, the insulating region NR is formed by inhibiting the replacement of the sacrificial layer with the word line WL. However, the method of securing the insulating region in the stacked body is not limited thereto. For example, in the region corresponding to the insulating region, the insulating region can also be formed in the stacked body by digging the stacked body before the replacement with the word line WL and embedding the insulating layer such as a silicon oxide layer therein. Alternatively, instead of forming the insulating region NR, the outer periphery of the conductive member of the contact C4 may be covered with a thick insulating layer to insulate the contact C4 from the surrounding word line WL or the like.

First Modification Example

Next, the semiconductor device of a first modification example of the first embodiment will be described with reference to FIGS. 5A and 5B. In the following first modification example, a method of determining the ratio α will be described with some examples.

Figure 5A:
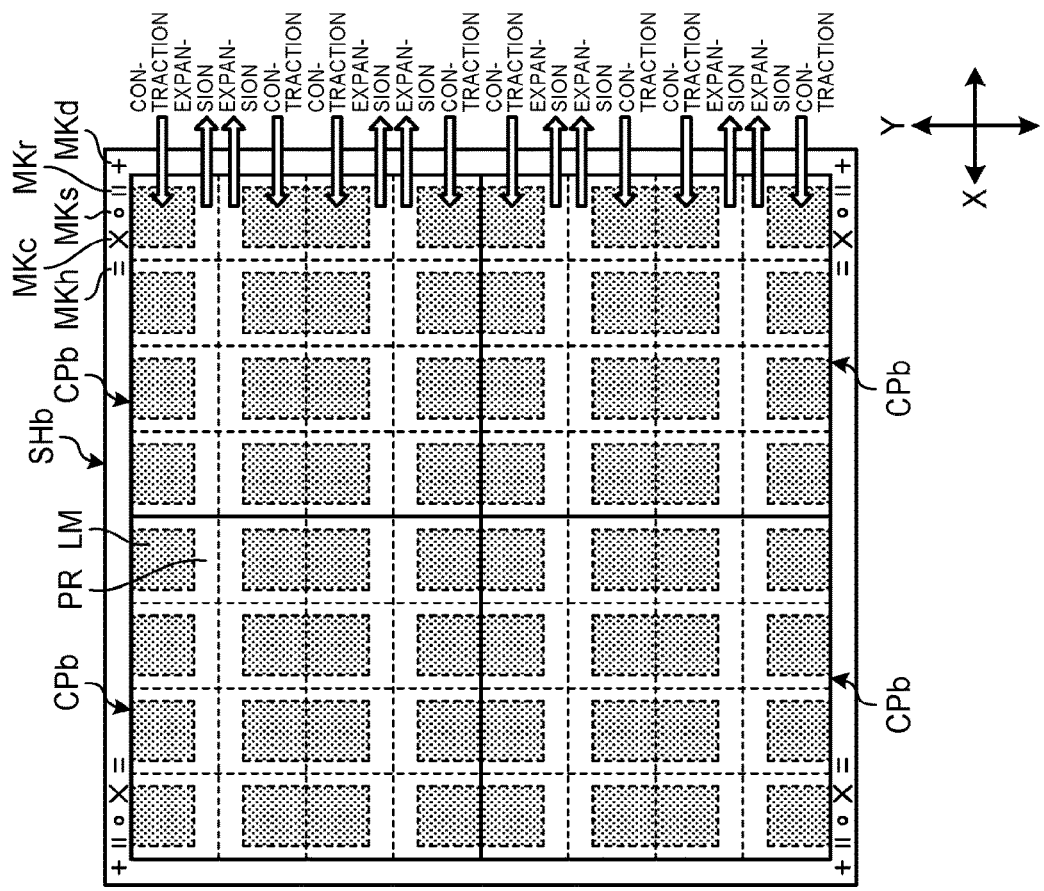
FIGS. 5A and 5B are diagrams illustrating some examples of a plane arrangement of the semiconductor device according to a first modification example of the first embodiment.
Figure 5B:
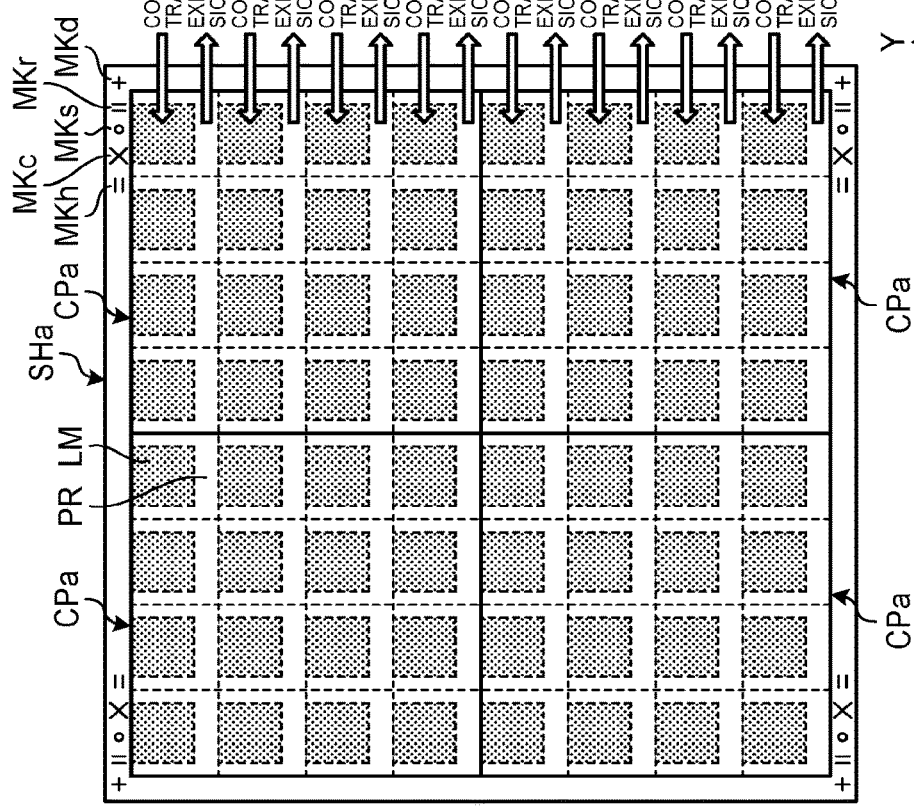

FIGS. 5A and 5B are diagrams illustrating some examples of a plane arrangement of the semiconductor device according to the first modification example of the first embodiment. FIG. 5A illustrates an example of a case in which planes are arranged in translational symmetry in the Y direction in one semiconductor device. FIG. 5B is an example of a case in which planes are arranged in mirror symmetry and translational symmetry in the Y direction in one semiconductor device.

In the example of FIG. 5A, the semiconductor device of the first modification example includes 16 planes within a chip region CPa of the semiconductor device. The four chip regions CPa constitute one shot region SHa, and in the manufacturing process of the semiconductor device, the region including a total of 64 planes included in the four chip regions CPa is collectively exposed and developed.

In the Y direction within one shot region SHa, for example, the stacked body LM that tends to shrink due to contraction stress and the peripheral region PR that tends to expand due to tensile stress are alternately arranged, and the planes are arranged in translational symmetry, that is, periodically in the Y direction.

Therefore, in the semiconductor device of the first modification example illustrated in FIG. 5A, the misalignment correction may be performed using, for example, a constant ratio α over the entire Y direction within one shot region SHa.

Note that a plurality of alignment marks MKd, MKr, MKs, MKc, MKh, and the like are arranged at, for example, four corners within one shot region SHa. These alignment marks MKd, MKr, MKs, MKc, and MKh are used for alignment between the photomask and the substrate SB when transferring a pattern for forming a predetermined structure to a resist film.

The alignment mark MKd is a mark for forming the wirings D2, the alignment mark MKr is a mark for forming the columnar portions HR, the alignment mark MKs is a mark for forming the contacts LI, the alignment mark MKc is a mark for forming the contacts C4, and the alignment mark MKh is a mark for forming the plugs CH.

In this way, the alignment marks MKd, MKr, MKs, MKc, and MKh are formed on the substrate SB one by one for one photomask, for example.

Also in the example of FIG. 5B, the semiconductor device of the first modification example includes 16 planes within a chip region CPb of the semiconductor device, and four chip regions CPb constitute one shot region SHb.

In the Y direction within one shot region SHb, the planes are arranged in mirror symmetry to be upside down in each row. That is, two stacked bodies LM adjacent to each other in the Y direction and two peripheral regions PR adjacent to each other in the Y direction are alternately arranged.

Therefore, in the semiconductor device of the first modification example illustrated in FIG. 5B, it is considered that the stress balance differs depending on the position in the Y direction within one shot region SHb. In such a case, the value of the ratio α may be biased according to the position in the Y direction within one shot region SHb or within one plane. That is, for example, different ratios $α_{IN}$ and $α_{OUT}$ may be set for the end portion on a side where the two stacked bodies LM are adjacent to each other and the end portion on a side adjacent to the peripheral region PR.

Second Modification Example

Next, the semiconductor device of a second modification example of the first embodiment will be described with reference to FIG. 6. In the semiconductor device of the second modification example, a region different from that in the semiconductor device 1 of the first embodiment described above is the minimum unit.

In the above-described first embodiment, an example in which the region between the two contacts LI is the minimum unit RU in the Y direction has been described, but the configuration corresponding to the minimum unit can be changed depending on the arrangement of various configurations of the semiconductor device.

Figure 6:
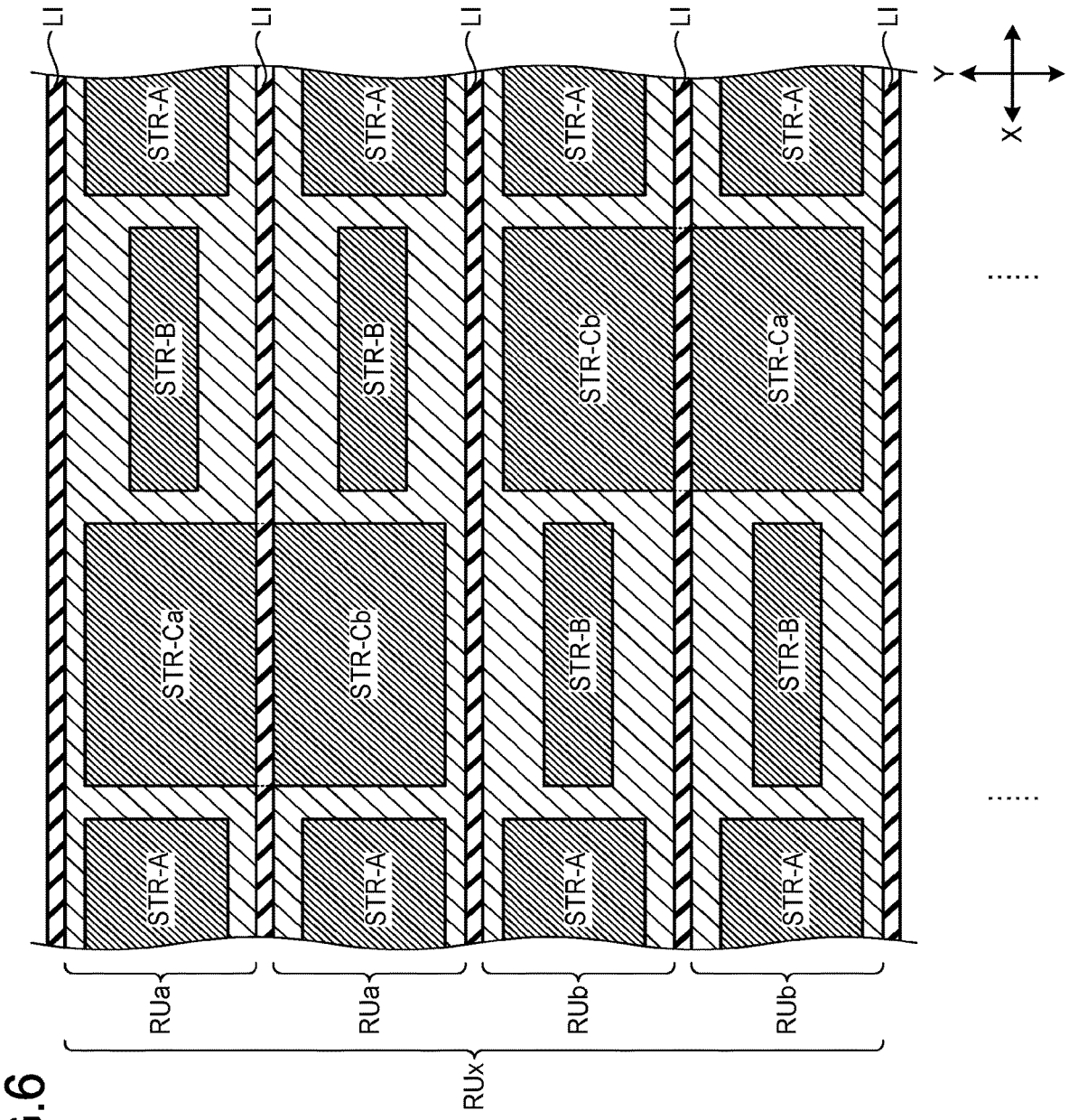
FIG. 6 is a diagram illustrating an example of a minimum unit of the semiconductor device according to a second modification example of the first embodiment.

FIG. 6 is a diagram illustrating an example of a minimum unit RUx of the semiconductor device according to the second modification example of the first embodiment. As illustrated in FIG. 6, in the semiconductor device of the second modification example, a region in which four regions RUa and RUb each of which is between two contacts LI are arranged in the Y direction corresponds to the minimum unit RUx.

The semiconductor device of the second modification example includes a configuration STR-A, a configuration STR-B, and configurations STR-Ca or STR-Cb between the two contacts LI. In a case where the arrangement order of these configurations in the X direction differs in the regions RUa and RUb each of which is between the two contacts LI, in a case of having a configuration arranged across one contact LI, or the like, a region in which a plurality of regions each of which is between the two contacts LI are arranged in the Y direction can be the minimum unit.

In the semiconductor device of the second modification example, in the region RUa, the configurations are arranged in order of the configuration STR-A, the configuration STR-B, and the configurations STR-Ca or STR-Cb from the right side of the paper. On the other hand, in the region RUb, the configurations are arranged in order of the configuration STR-A, the configurations STR-Ca or STR-Cb, and the configuration STR-B from the right side of the paper. In addition, the configurations STR-Ca and STR-Cb are arranged across one contact LI.

As a result, in the semiconductor device of the second modification example, the four regions RUa, RUa, RUb, and RUb arranged in the Y direction constitute one minimum unit RUx.

Therefore, in a case where the correction method of the first embodiment is applied to the semiconductor device of the second modification example, regarding the structure of each of the upper layer, the intermediate layer, and the lower layer, in the minimum unit RUx, each of the distance between the geometric centers of the structure of the intermediate layer and the structure of the lower layer, and the distance between the geometric centers of the structure of the intermediate layer and the structure of the upper layer differs between any two positions in the Y direction.

The above-described configuration STR-A may be, for example, a memory region. The configuration STR-B may be, for example, a penetrating contact region. The configurations STR-Ca and STR-Cb may be, for example, a staircase region arranged in the central region rather than in the end portion of the stacked body. In a case where the staircase region is arranged in the central region of the stacked body, the configurations STR-Ca and STR-Cb are arranged across, for example, the two regions RUa and RUa or the two regions RUb and RUb by digging the stacked body into a mortar-like shape, leading out the word lines of each layer in a staircase pattern, and separating those by the contacts LI.

Second Embodiment

Hereinafter, a second embodiment will be described in detail with reference to the drawings. The second embodiment is different from the first embodiment in that the misalignment correction is performed on a plurality of structures arranged in the same hierarchy.
(Configuration Example of Semiconductor Device)

The semiconductor device of the second embodiment will be described by borrowing FIGS. 1A, 1B, and 2 of the above-described first embodiment. As illustrated in FIGS. 1A, 1B, and 2 to be borrowed, the semiconductor device of the second embodiment also has, for example, the same configuration as the semiconductor device 1 of the above-described first embodiment.

However, in the semiconductor device of the second embodiment, for example, the slits for forming the contacts LI as the second structure and the holes for forming the contacts C4 as the first structure are collectively formed in the same photolithography process.

That is, in the semiconductor device of the second embodiment, in order to form the contacts C4, and the wirings D2 as the third structure and the plugs CH as the fourth structure which are connected to upper and lower ends of the contacts C4, a total of three types of photomasks which are a photomask for forming the wirings D2, a photomask for forming the contacts C4 and the contacts LI, and a photomask for forming the plugs CH are used. The photomask for forming the plugs CH to be connected to the contacts C4 is also a photomask for forming the plugs CH as the fifth and sixth structures to be connected to the contacts LI and the pillars PL, respectively.

At this time, as described above, the contact C4 may have poor connection with the wiring D2 and the plug CH due to the misalignment. Since the contact LI is also connected to the plug CH as described above, the poor connection with the plug CH may occur due to the misalignment of the contact LI. Further, the misalignment of the contact LI may cause contact between the contact LI and the adjacent pillar PL in the memory region MR.

Therefore, in the semiconductor device of the second embodiment, for example, the misalignment correction with respect to the plug CH is performed for both the contact C4 and the contact LI.

Here, as described above, since the upper surface of the pillar PL is connected to the plug CH, the misalignment correction is performed such that, for example, the positions of the geometric centers of the pillar PL and the plug CH substantially overlap with each other. Therefore, by correcting the misalignment of the contacts LI with respect to the plugs CH, it is possible to indirectly correct the misalignment between the contacts LI and the pillars PL.

(Example of Misalignment Correction of Semiconductor Device)

FIGS. 7Aa to 7Cb are diagrams for describing misalignment correction using the photomask of the second embodiment. Examples of FIGS. 7Aa to 7Cb illustrate a case where the positions of the contacts C4 with respect to the plugs CH are not corrected, a case where the positions of the contacts C4 with respect to the plugs CH are 100% corrected, and a case where the positions of the contacts C4 with respect to the plugs CH are 40% corrected.

In the following description, in order to distinguish the contacts C4 and LI from each other, the configuration relating to the contact LI will be described as a slit ST. This is because a slit pattern STp on the photomask is transferred to the stacked body LM to form the slit ST, and the slit ST is filled to form the contact LI.

Further, in FIGS. 7Aa to 7Cb, the configurations of the wiring pattern D2p, the contact pattern C4p, and the plug pattern CHp on the photomasks and the positional relationship and the misalignment amount among the wiring D2, the contact C4, and the plug CH on the substrate SB of a case where the positions of the contacts C4 with respect to the plugs CH are not corrected, a case where the positions of the contacts C4 with respect to the plugs CH are 100% corrected, and a case where the positions of the contacts C4 with respect to the plugs CH are 40% corrected are the same as those in the examples of FIGS. 3Aa to 3Cb of the above-described first embodiment.

Therefore, in the following description, the positional relationship between the contact pattern C4p and the slit pattern STp on the photomask, and the positional relationship and the misalignment amount between the contact C4 and the slit ST on the substrate SB will be mainly described.

FIG. 7Aa is a diagram schematically illustrating a top view of photomasks in which the misalignment of the contacts C4 and the slits ST with respect to the plugs CH is not corrected, and a top view and a sectional view of each structure formed in a case of using the photomasks. In FIG. 7Aa, the top views of the photomasks and each structure schematically illustrate a state of one end portion in the Y direction within the plane PN, a center portion within the plane PN, and the other end portion in the Y direction within the plane PN, from the upper side in the vertical direction.

As illustrated in FIG. 7Aa, in the photomask for forming the contacts C4 and the slits ST, similar to the contact patterns C4p, the slit patterns STp are also arranged at substantially equal intervals in the Y direction in one plane PN, and the positions of the geometric centers thereof also substantially match those of the wiring pattern D2p and the plug pattern CHp.

Here, two slit patterns STp are included within the region corresponding to the minimum unit RU in the photomask. Therefore, the position of the geometric center of the slit pattern STp is the position of the geometric center of the entirety of two slit patterns STp. That is, the position of the geometric center of the two slit patterns STp is the center position of the two slit patterns STp in the Y direction.

When these photomasks are used to sequentially form the wirings D2, the contacts C4, the slits ST, and the plugs CH on the substrate SB, since the contacts C4 and the slits ST are arranged in the same hierarchy and have substantially the same misalignment amount, the positional relationships of the contact C4 and the slit ST with respect to the plug CH are substantially equal over the entire position in the Y direction within the plane PN.

Referring to the A-A section of one end portion of the plane PN in the Y direction, the slits ST on both sides of the contact C4 in the Y direction are arranged substantially equidistant with respect to the contact C4, but are misaligned with respect to the plug CH.

FIG. 7Ab is a graph schematically illustrating the misalignment amount of each structure in a case of using the photomasks in which the misalignment of the contacts C4 and the slits ST with respect to the plugs CH is not corrected. The horizontal axis of the graph is the Y coordinate position in the plane PN, and the vertical axis is the misalignment amount in the Y direction.

As illustrated in FIG. 7Ab, the misalignment amount MSs between the slit ST and the plug CH substantially matches the misalignment amount MSt between the contact C4 and the plug CH over the entire position in the Y direction within the plane PN.

FIG. 7Ba is a diagram schematically illustrating a top view of photomasks in which the misalignment of the contacts C4 and the slits ST with respect to the plugs CH is 100% corrected, and a top view and a sectional view of each structure formed in a case of using the photomasks.

As illustrated in FIG. 7Ba, the contact patterns C4p and the slit patterns STp on the photomask for forming the contacts C4 and the slits ST are 100% corrected in accordance with the positions of the plugs CH on the substrate SB in the actual semiconductor device 1.

As a result, the interval between the contact patterns C4p and the interval between the slit patterns STp on the photomask are increased more than the interval between the wiring patterns D2p and the interval between the plug patterns CHp on other photomasks as being toward the positions corresponding to both sides of the plane PN in the Y direction.

In this manner, when the photomasks are superposed, the positions of the geometric centers of the wiring patterns D2p and the plug patterns CHp substantially match at any position in the Y direction within the plane PN, and the positions of the geometric centers of the contact patterns C4p and the slit patterns STp are shifted outward in the Y direction as being toward both sides in the Y direction within the plane PN.

At this time, the interval between the contact patterns C4p and the interval between the slit patterns STp are increased with a correlation, and the intervals between the positions of the geometric centers of the contact patterns C4p and the positions of the geometric centers of the slit patterns STp within one minimum unit RU substantially match over the entire Y direction in the plane PN.

When these photomasks are used to sequentially form the wirings D2, the contacts C4, the slits ST, and the plugs CH on the substrate SB, since the positions of the contacts C4 and the slits ST are adjusted to match the positions of the plugs CH, the plug CH is connected to the substantially center position of the contact C4, and is arranged at substantially center position between two slits ST within one minimum unit RU over the entire position in the Y direction within the plane PN. As a result, it is considered that the plug CH is also connected to the contact LI itself at a position (not illustrated) with almost no misalignment. It is also considered that the contact between the slit ST and the pillar PL is suppressed.

Referring to the A-A section of one end portion of the plane PN in the Y direction, the plug CH is also arranged at the substantially center position of the contact C4 and the slits ST.

FIG. 7Bb is a graph schematically illustrating the misalignment amount of each structure in a case of using the photomasks in which the misalignment of the contacts C4 and the slits ST with respect to the plugs CH is 100% corrected.

As illustrated in FIG. 7Bb, the misalignment amount MSs between the slit ST and the plug CH has the lowest value over the entire position in the Y direction in the plane PN, similar to the misalignment amount MSt between the contact C4 and the plug CH.

FIG. 7Ca is a diagram schematically illustrating a top view of photomasks in which the misalignment of the contacts C4 with respect to the plugs CH is 40% corrected, and a top view and a sectional view of each structure formed in a case of using the photomasks. On the other hand, since the tolerance of the misalignment amount between the slit ST and the pillar PL is small, the misalignment of the slit ST with respect to the plug CH is 100% corrected, for example.

As illustrated in FIG. 7Ca, the slit patterns STp on the photomask for forming the contacts C4 and the slits ST are 100% corrected in accordance with the positions of the plugs CH on the substrate SB in the actual semiconductor device 1.

As a result, the interval between the slit patterns STp on the photomask is increased more than the interval between the contact patterns C4p which are corrected by less than 100% in accordance with the positions of the plugs CH on the substrate SB in the actual semiconductor device 1, as being toward the positions corresponding to both sides of the plane PN in the Y direction.

In this manner, the positions of the geometric centers of the slit patterns STp are shifted outward in the Y direction more than the positions of the geometric centers of the contact patterns C4p as being toward both sides in the Y direction within the plane PN. Therefore, the distance between the geometric centers of the contact pattern C4p and the slit pattern STp within one minimum unit RU is increased as being toward both sides of the plane PN in the Y direction.

Among the photomasks for forming the contacts C4 and the slits ST illustrated in FIGS. 7Aa, 7Ba, and 7Ca, the photomask illustrated in FIG. 7Ca corresponds to the photomask of the second embodiment.

When these photomasks illustrated in FIG. 7Ca are used to sequentially form the wirings D2, the contacts C4, the slits ST, and the plugs CH on the substrate SB, although the center positions of the contacts C4 and the plugs CH do not perfectly match over the entire position in the Y direction within the plane PN, the center positions of the slits ST and the plugs CH substantially match over the entire position in the Y direction within the plane PN.

Referring to the A-A section of one end portion of the plane PN in the Y direction, the plug CH is slightly shifted outward in the Y direction from the center position of the contact C4, but is arranged at the substantially center of the two slits ST in the minimum unit RU.

FIG. 7Cb is a graph schematically illustrating the misalignment amount of each structure in a case of using the photomasks in which the misalignment of the contacts C4 with respect to the plugs CH is 40% corrected and the misalignment of the slits ST with respect to the plugs CH is 100% corrected.

As illustrated in FIG. 7Cb, the misalignment amount MSs between the slit ST and the plug CH has the lowest value over the entire position in the Y direction in the plane PN.

In addition, in FIGS. 7Ab, 7Bb, and 7Cb described above, the change in misalignment amount between the structures in the Y direction is represented by a linear graph, but each of the graphs is merely a schematic graph.

As in the correction method of the second embodiment, it is possible to correct a plurality of correction target structures such as the contact C4 and the slit ST with different correction amounts on the basis of the tolerance of misalignment of each of the plurality of correction target structures. More specifically, the contact C4 is corrected on the basis of Equation (1) described above. The ratio α in Equation (1) is a numerical value less than 1.

Further, the slit ST is corrected on the basis of Equation (2) described below as the correction amount Δd'(x,y) in a case where the correction amount $\Delta d_0'(x,y)$ at the time of 100% correction of the slits ST with respect to the plugs CH is equal to or greater than the threshold value Δdth'.

$$\Delta d'(x,y) = \Delta dth' + \beta(\Delta d_0'(x,y) - \Delta dth') \qquad (2)$$

Here, in the above-described example a ratio β is 1, but more generally, the ratio β may be a numerical value less than 1 which is different from the ratio α. The ratio β is determined on the basis of, for example, the misalignment amount between the slit ST and the plug CH on the actual substrate SB, the misalignment amount between the slit ST and the pillar PL on the actual substrate SB, and the value of the tolerance of these misalignment amounts.

Further, as in the case of Equation (1), Equation (2) described above may be a higher-order equation. Further, in a case where the misalignment amount, the tendency of misalignment, and the like differ between the X direction and the Y direction within the plane PN, different ratios β may be used for the X direction and the Y direction.

The contacts C4 are formed using Equation (1) described above, so that the semiconductor device of the second embodiment also has at least one of the following configurations.

That is, the misalignment amount between the contact C4 and the wiring D2 and the misalignment amount between the contact C4 and the plug CH have a correlation. In addition, a predetermined amount of misalignment other than zero occurs between the contact C4 and the wiring D2, and between the contact C4 and the plug CH.

The contacts C4 are formed using Equation (1) described above and the slits ST are formed using Equation (2) described above, so that the semiconductor device of the second embodiment has at least one of the following configurations.

That is, the contact C4 and the contact LI have a relationship such that the distance between the geometric centers of the contact C4 and the contact LI within one minimum unit RU is increased as being toward both sides in the Y direction within one plane PN.

In such a case, the distance between the geometric centers of the contact C4 and the contact LI within one minimum unit RU differs between two positions in a predetermined direction such as the X direction or the Y direction. Here, the two positions in the predetermined direction can be arbitrarily selected, and for example, within the plane PN, the center position and the position of the end portion of the plane PN can be selected. However, in a case where two positions are selected across the planes PN, it is assumed that positions other than those corresponding to each other between the planes PN are selected rather than the same positions such as the center positions of the planes PN.

In addition, by correcting the contacts C4 with respect to the plugs CH by less than 100% and correcting the slits ST with respect to the plugs CH by 100%, the misalignment amount between the positions of the geometric centers of the contact C4 and the contact LI within one minimum unit RU is substantially equal to the misalignment amount between the contact C4 and the plug CH.

However, the misalignment amount of these structures may include the misalignment amount due to processes such as overlay (superposing) misalignment between different lithography processes, in addition to the misalignment amount affected by the stress.

As in the semiconductor device of the second embodiment, the fact that the contacts C4 and the contacts LI are collectively formed in the same photolithography process can be determined by, for example, analyzing the alignment mark remaining on the semiconductor device.

That is, among the alignment marks MKd, MKr, MKs, MKc, MKh, and the like illustrated in FIGS. 5A and 5B described above, the fact that the alignment marks MKc and MKs for the contact C4 and the contact LI are integrated can be treated as a proof of the collective formation of the contacts C4 and the contacts LI.

The positional relationship between the contact C4 and the wiring D2, the positional relationship between the contact C4 and the plug CH, the positional relationship between the contact C4 and the contacts LI, and the like may be the positional relationships in a case where the upper end of the contact C4, the upper surface of the wiring D2, the upper end of the plug CH, and the upper ends of the contacts LI are compared.

Further, since two contacts LI are included within one minimum unit RU, the position of the geometric center of the contact LI is the position of the geometric center of the entirety of the two contacts LI as described above. Within one minimum unit RU, even in a case where a plurality of other structures are arranged within one minimum unit RU as in a case where a plurality of contacts C4 are arranged not only in the X direction but also in the Y direction, the position of the geometric center described above may be the position of the geometric center in the entirety of the plurality of structures thereof.

Further, in a case where the contacts C4 are formed using Equation (1) described above and the slits ST are formed using Equation (2) described above, the photomask of the second embodiment has, for example, the configuration illustrated in FIGS. 8A and 8B below.

Figure 8A:
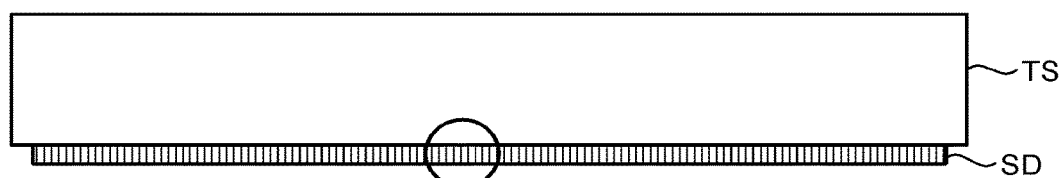
FIGS. 8A and 8B are schematic views illustrating an example of a configuration of the photomask used in forming contacts and slits of a semiconductor device according to the second embodiment.
Figure 8B:
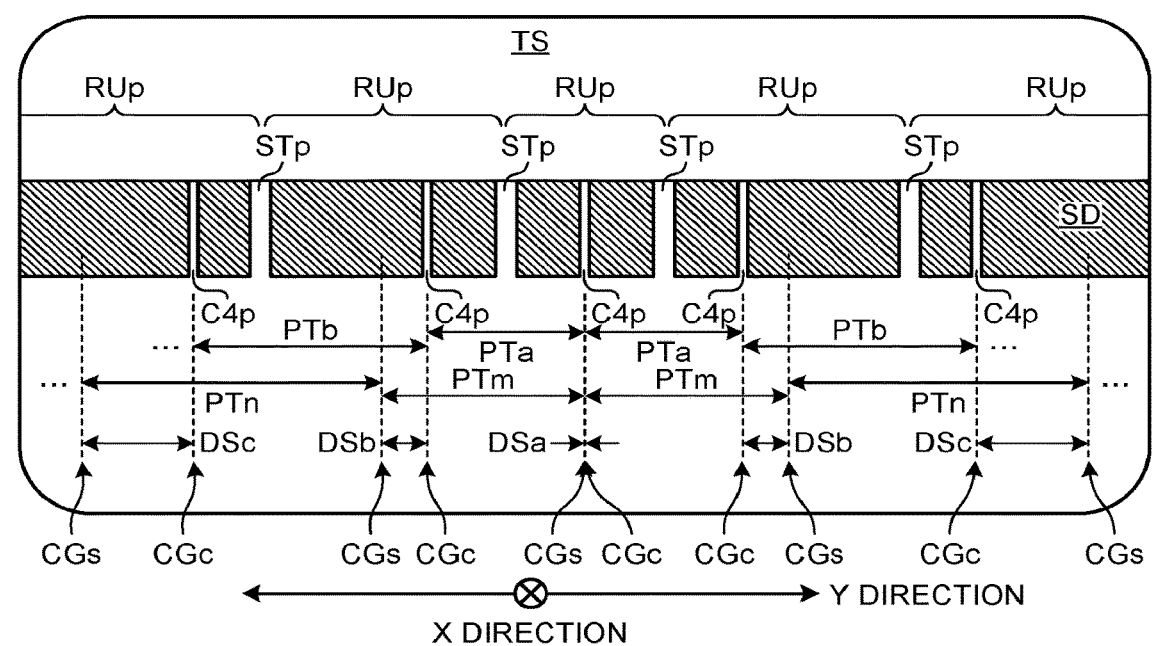

FIGS. 8A and 8B are schematic views illustrating an example of a configuration of a photomask 20 used in forming the contacts C4 and the slits ST of the semiconductor device according to the second embodiment. FIG. 8A is a sectional view of the photomask 20 along the Y direction, and FIG. 8B is a partially enlarged sectional view of the photomask 20. The Y direction in FIGS. 8A and 8B coincides with the Y direction of the semiconductor device of the second embodiment.

Further, FIGS. 8A and 8B illustrate an example of a case in which the ratio $\beta$ in Equation (2) is larger than the ratio $\alpha$ in Equation (1) ($\beta \le 1$, $\alpha < \beta$). That is, it is assumed that the correction amount of misalignment of the slit ST with respect to the plug CH is set to be larger than the correction amount of misalignment of the contact C4 with respect to the plug CH.

As illustrated in FIG. 8A, the photomask 20 also includes the transparent substrate TS as a mask substrate, and the opaque film SD formed on the transparent substrate TS.

As illustrated in FIG. 8B, the opaque film SD of the photomask 20 has a plurality of contact patterns C4p as the first pattern arranged in the Y direction, and a plurality of slit patterns STp as the second pattern arranged in the Y direction. The contact pattern C4p is a through-hole provided in the opaque film SD, and the slit pattern STp is a through-groove extending in the X direction provided in the opaque film SD.

FIG. 8B illustrates a section of the photomask 20 corresponding to a portion in the vicinity of the center of, for example, one plane PN, that is, one stacked body LM in the Y direction, and a region between two slit patterns STp arranged on both sides in the Y direction with one contact pattern C4p interposed therebetween corresponds to the minimum unit RUp in the photomask 20.

Here, the configuration of the contact pattern C4p in the photomask 20 is the same as the configuration of the contact pattern C4p in the photomask 10 of the first embodiment described above.

In the photomask 20, the distance between the geometric center CGs of the slit pattern STp within one minimum unit RUp and the geometric center CGs of the slit pattern STp within the adjacent minimum unit RUp, that is, the distances PTm, PTn, . . . between the geometric centers of the slit patterns STp within the adjacent minimum units RUp are increased as being toward the outer sides in the Y direction within the region of the photomask 20 corresponding to one plane PN. That is, PTm<PTn< . . . .

Further, within one plane PN, the distances PTm, PTn, . . . between the geometric centers of the slit patterns STp are larger than the distances PTa, PTb, . . . between the geometric centers of the contact patterns C4p. That is, PTa<PTm, PTb<PTn . . . .

As a result, the distances between the geometric centers CGc of the contact patterns C4p and the geometric centers CGs of the slit patterns STp within one minimum unit RUp, that is, the distances DSa, DSb, DSc, . . . between the geometric centers of the contact patterns C4p and the slit patterns STp are increased as being toward the outer sides in the Y direction within the region of the photomask 20 corresponding to the plane PN on the substrate SB. That is, DSa<DSb<DSc . . . .

Therefore, in the photomask 20, the distance between the geometric centers of the contact pattern C4p and the slit pattern STp differs between two positions in the Y direction, for example. Here, the two positions in the Y direction can be arbitrarily selected, and as long as the two positions are within the region corresponding to the plane PN of the photomask 20, the center position and the position of the end portion of the region can be selected. However, in a case where two positions are selected in regions across the planes PN, it is assumed that positions other than those corresponding to each other between the regions are selected rather than the same positions such as the center positions of the regions.

Further, in comparison between the photomask for forming the wirings D2 and the photomask for forming the plugs CH with the photomask 20, the distance between the geometric centers of the wiring patterns D2p, the distance between the geometric centers of the plug patterns CHp, the distance between the geometric centers of the contact patterns C4p, and the distance between the geometric centers of the slit patterns STp on the photomasks are substantially equal in the region in the vicinity of the center position within the plane PN. On the other hand, the distance between the geometric centers of the contact patterns C4p is increased more than the distances between the geometric centers of other patterns on the other photomasks as being toward both end portions in the Y direction, and the distance between the geometric centers of the slit patterns STp is increased more than the distance between the geometric centers of the contact patterns C4p as being toward both end portions in the Y direction.

The configuration of the second embodiment is not limited to the binary mask as described above, and can be applied to the phase shift mask, the reflective photomask of EUV lithography, the mold of NIL, drawing data used for electron beam lithography, and the like.

According to the semiconductor device of the second embodiment, in the minimum unit RU, the distance between the geometric centers of the contact C4 and the contact LI differs between any two positions in the Y direction. That is, according to the semiconductor device of the second embodiment, the contact C4 and the contact LI are corrected with respect to the position of the plug CH by using different ratios α and β.

As a result, it is possible to suppress the poor connection between structures arranged in different hierarchies. Further, even in a case where structures such as the contact C4 and the contact LI, having different tolerances with respect to a common connection target such as the plug CH are collectively formed, the misalignment correction can be performed with correction amounts suitable for the respective structures.

According to the photomask 20 of the second embodiment, in the minimum unit RUp, the distance between the geometric centers of the contact pattern C4p and the slit pattern STp differs between any two positions in the Y direction. As a result, it is possible to suppress the poor connection between structures arranged in different hierarchies, and it is possible to perform misalignment correction with correction amounts suitable for the respective structures.

In the above-described second embodiment, in a case where the contacts C4 and LI to be connected to the plug CH are collectively formed, the contacts C4 and LI are corrected by different ratios.

However, the above correction method may be applied even in a case where a structure in which the slit ST is filled with an insulating layer or the like is formed from the slit ST collectively formed with the contact C4. In this case, although the structure formed from the slit ST is not connected to the plug CH, it is desirable that the contact between the structure and the pillar PL of which the misalignment with respect to the plug CH is corrected is suppressed, and it is preferable that the misalignment of the structure with respect to the plug CH is corrected at a predetermined ratio.

In addition, one or both of the plate-like portions BR as the second structure at both end portions of the insulating region NR where the contacts C4 are arranged and the plate-like portion BP as the second structure on the outer side of the stacked body LM (refer to FIG. 1A) may be collectively formed in the same photolithography process together with the contact C4 and the contact LI. Even in this case, the misalignment of the contact LI, the plate-like portion BR, and the plate-like portion BP can be corrected at different ratios.

Further, the contact C4 may be collectively formed with, for example, the columnar portion HR in the same photolithography process. It is preferable that the contact between the columnar portion HR and the contact LI is suppressed, and it is preferable that the contact between the columnar portion HR and the contact CC in the staircase region SR is suppressed. Therefore, in order to suppress the contact with these contacts LI and CC, the misalignment of the columnar portion HR with respect to the plug CH can be corrected at a predetermined ratio, for example.

Further, the contact C4 may be not only the contact C4 in the penetrating contact region TPc as in the above example, but also the contact C4 arranged in the penetrating contact region TPw. Further, the above correction method may be applied even in a case where, in place of or in addition to the contact C4, the above-described contact C3, the contact LI and the plate-like portions BR and BP, and the like as the second structure are collectively formed. In this case, the plane PN in the above description can be read as an independent operating element including a configuration such as the contact C3 in addition to the plane PN.

As described above, the correction method of the second embodiment can be applied to, for example, a case where a structure to be connected to structures arranged in the upper and lower hierarchies and a structure to be connected to a structure arranged in one of the upper and lower hierarchies are collectively formed in the same photolithography process. Further, the correction method of the second embodiment can be applied to, for example, a case where a structure to be connected to structures arranged in the upper and lower hierarchies and a structure arranged with an interval from another structure in the same hierarchy are collectively formed in the same photolithography process.

Modification Example

Next, the configuration of the modification example of the second embodiment will be described using FIGS. 9Aa to 9Bb. The configuration of the modification example is different from the above-described second embodiment in that among the contacts C4 and the slits ST, the misalignment of the contacts C4 is not corrected and the misalignment of the slits ST is corrected.

FIGS. 9Aa to 9Bb are diagrams for describing misalignment correction using a photomask of the modification example of the second embodiment.

FIGS. 9Aa and 9Ab illustrate an example of a case where the misalignment of the contacts C4 and the slits ST with respect to the plugs CH is not corrected.

As illustrated in FIGS. 9Aa and 9Ab, the contact C4 is misaligned with respect to the wiring D2 and the plug CH, but both the misalignment amounts MSt and MSb thereof are within the designed tolerances AVt and AVb.

On the other hand, the slit ST is misaligned with respect to the plug CH, and the misalignment amount MSs thereof exceeds the designed tolerance AVs.

In such a case, the misalignment of the slit ST is corrected on the basis of Equation (2) described above, but the misalignment of the contact C4 may not be corrected.

FIGS. 9Ba and 9Bb illustrate an example of a case where the misalignment of the contacts C4 with respect to the plugs CH is not corrected and the misalignment of the slits ST with respect to the plugs CH is corrected. In FIGS. 9Ba and 9Bb, the slits ST are 100% corrected in consideration of the tolerance AVs of the misalignment amount MSs between the slit ST and the plug CH.

In such a process, all of the misalignment amount MSt between the contact C4 and the plug CH, the misalignment amount MSb between the contact C4 and the wiring D2, and the misalignment amount MSs between the slit ST and the plug CH can be within the tolerances AVt, AVb, and AVs, respectively.

In the photomasks used in such a process, the relative relationships such as the distance between the geometric centers of the slit patterns, the distance between the geometric centers of the contact pattern and the slit pattern, and the like are similar to those in the photomask 20 of the second embodiment.

In the semiconductor device manufactured by such a process, the relative positional relationships of the respective configurations such as the contact C4, the slit ST, the plug CH, and the wiring D2 are similar to those in the semiconductor device of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   first and second structures arranged in a first hierarchy, the first and second structures being repeatedly arranged in a first direction along a plane of the first hierarchy,
   a third structure that is repeatedly arranged in the first direction in a second hierarchy which is a lower layer of the first hierarchy; and
   a fourth structure that is repeatedly arranged in the first direction in a third hierarchy which is an upper layer of the first hierarchy, wherein
   a distance between geometric centers of the first and second structures in a minimum unit of repetition of the first and second structures differs at a first position and a second position in the first direction,
   the minimum unit includes the third and fourth structures, and
   in the minimum unit, each of a distance between geometric centers of the first and third structures and a distance between geometric centers of the first and fourth structures differs at the first position and the second position.

2. The semiconductor device according to claim 1, wherein the first hierarchy includes a memory region in which a plurality of memory cells are three-dimensionally arranged, and
   the distance between the geometric centers of the first and second structures is increased as being toward an end portion of the memory region in the first direction from a center of the memory region.

3. The semiconductor device according to claim 1, wherein in the minimum unit, a distance between geometric centers of the second and fourth structures is substantially constant over the first direction.

4. The semiconductor device according to claim 1, wherein the distance between the geometric centers of the first and second structures in the minimum unit and the distance between the geometric centers of the first and fourth structures in the minimum unit are substantially equal within the same minimum unit.

5. The semiconductor device according to claim 1, wherein the third and fourth structures are electrically connected via the first structure, and
   the second structures are arranged with the first structure interposed between the second structures in the first direction within the minimum unit.

6. The semiconductor device according to claim 1, wherein a stacked body in which a plurality of conductive layers are stacked via an insulating layer is arranged in the first hierarchy, the stacked body including a plurality of three-dimensionally arranged memory cells, and
   a peripheral circuit that contributes to an operation of the plurality of memory cells is arranged in a lower layer of the second hierarchy.

7. The semiconductor device according to claim 6, wherein the first structure is a contact that penetrates the stacked body in a stacking direction of the stacked body and electrically connects one of the plurality of conductive layers and the peripheral circuit.

8. The semiconductor device according to claim 6, wherein the second structure is a source line contact that penetrates the stacked body in a stacking direction of the stacked body.

9. The semiconductor device according to claim 6, wherein the second structure is a plate-like portion that is provided to secure an insulating region in the stacked body and penetrates the stacked body in a stacking direction of the stacked body.

10. The semiconductor device according to claim 6, wherein the third structure is a wiring that is electrically connected to the peripheral circuit, and
    the fourth structure is a plug that is electrically connected to one of the plurality of conductive layers.

11. A semiconductor device comprising:
    a stacked body which is arranged in a first hierarchy, and in which a plurality of conductive layers are stacked via an insulating layer, the stacked body including a plurality of three-dimensionally arranged memory cells;
    a plurality of contacts which penetrate the stacked body in a stacking direction of the stacked body and are repeatedly arranged in a first direction along a plane of the first hierarchy;

a plurality of wirings which are repeatedly arranged in the first direction in a second hierarchy that is a lower layer of the first hierarchy, and are each electrically connected to a corresponding contact among of the plurality of contacts;

a peripheral circuit which is arranged in a lower layer of the second hierarchy and contributes to an operation of the plurality of memory cells; and a plurality of plugs which are repeatedly arranged in the first direction in a third hierarchy that is an upper layer of the first hierarchy, and are each electrically connected to a corresponding contact among of the plurality of contacts, wherein in a minimum unit of repetition of the contact, the wiring, and the plug, at least one of a first distance between geometric centers of the contact and the wiring and a second distance between geometric centers of the contact and the plug differs at a first position and a second position in the first direction, and a discontinuous point where a change tendency of the at least one of the first distance and the second distance is discontinuous is present between the first position and the second position, the change tendency keeping one of an increasing tendency and a decreasing tendency and not including the other of the increasing tendency and the decreasing tendency between the first position and the discontinuous point and between the discontinuous point and the second position.

12. The semiconductor device according to claim 11,
wherein the first hierarchy includes a memory region in which the plurality of memory cells are three-dimensionally arranged, and
each of the first distance and the second distance is increased as being toward an end portion of the memory region in the first direction from a center of the memory region.

13. A photomask comprising:
a mask substrate; and
first and second patterns arranged on the mask substrate,
wherein the first and second patterns are repeatedly arranged in a first direction along a plane of the mask substrate, a distance between geometric centers of the first and second patterns in a minimum unit of repetition of the first and second patterns differs at a first position and a second position in the first direction, and the second patterns are arranged with the first pattern interposed between the second patterns in the first direction within the minimum unit.

14. The photomask according to claim 13,
wherein a first hierarchy of a semiconductor device which is a transfer target of the first and second patterns includes a memory region in which a plurality of memory cells are three-dimensionally arranged, and
the distance between the geometric centers is increased from a position corresponding to a center of the memory region toward a position corresponding to an end portion of the memory region in the first direction.

15. The photomask according to claim 13,
wherein the second pattern has a longitudinal direction in a second direction that intersects the first direction along the plane of the mask substrate.

16. The photomask according to claim 13,
wherein in a first hierarchy of a semiconductor device which is a transfer target of the first and second patterns, a stacked body in which a plurality of conductive layers are stacked via an insulating layer is arranged, the stacked body including a plurality of three-dimensionally arranged memory cells.

17. The photomask according to claim 16,
wherein the first pattern is a pattern for transferring a hole that penetrates the stacked body in a stacking direction of the stacked body, to the first hierarchy.

18. The photomask according to claim 16,
wherein the second pattern is a pattern for transferring a slit that separates the stacked body in a direction intersecting a stacking direction of the stacked body to form a block of the semiconductor device, to the first hierarchy.

* * * * *